(12) United States Patent
Ikeda et al.

(10) Patent No.: US 12,349,269 B2
(45) Date of Patent: Jul. 1, 2025

(54) WIRING BOARD

(71) Applicant: TORAY INDUSTRIES, INC., Tokyo (JP)

(72) Inventors: Ryutaro Ikeda, Otsu (JP); Toshiya Kodama, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 213 days.

(21) Appl. No.: 18/030,828

(22) PCT Filed: Oct. 29, 2021

(86) PCT No.: PCT/JP2021/040014
§ 371 (c)(1),
(2) Date: Apr. 7, 2023

(87) PCT Pub. No.: WO2022/130803
PCT Pub. Date: Jun. 23, 2022

(65) Prior Publication Data
US 2023/0309217 A1 Sep. 28, 2023

(30) Foreign Application Priority Data

Dec. 15, 2020 (JP) .................. 2020-207270
Aug. 20, 2021 (JP) .................. 2021-134669

(51) Int. Cl.
*H05K 1/02* (2006.01)
*H05K 3/06* (2006.01)
(Continued)

(52) U.S. Cl.
CPC ............ *H05K 1/0274* (2013.01); *H05K 3/06* (2013.01); *H05K 3/287* (2013.01); *H05K 1/0306* (2013.01);
(Continued)

(58) Field of Classification Search
CPC ........ H05K 1/0274; H05K 3/06; H05K 3/287; H05K 1/0306; H05K 1/0326; H05K 1/09;
(Continued)

(56) References Cited

U.S. PATENT DOCUMENTS

2002/0005922 A1* 1/2002 Umemoto ......... G02F 1/133615
349/65
2008/0176042 A1* 7/2008 Nashiki ................... G06F 3/044
216/95

(Continued)

FOREIGN PATENT DOCUMENTS

EP 3 012 714 A1 4/2016
JP 2009-76432 A 4/2009
(Continued)

OTHER PUBLICATIONS

International Search Report, issued in PCT/JP2021/040014, PCT/ISA/210, dated Nov. 22, 2021.
(Continued)

Primary Examiner — Timothy J Thompson
Assistant Examiner — Paramita Ghosh
(74) Attorney, Agent, or Firm — Birch, Stewart, Kolasch & Birch, LLP

(57) ABSTRACT

The purpose of the present invention is to provide a wiring board on which an opaque wiring electrode is less visible. The wiring board comprises a transparent substrate, an opaque wiring electrode patterned on at least one surface of the transparent substrate, and a transparent protective layer formed on the transparent substrate and the opaque wiring electrode. The part where the opaque wiring electrode is formed has an internal reflectivity R1 of 0.1% or less, which is measured from the transparent protective layer of the wiring board, and a refractive index n1 of the transparent substrate and a refractive index n2 of the transparent pro-
(Continued)

tective layer satisfy the following formula (1). $0.97 \leq n2/n1 \leq 1.03$ (1)

7 Claims, 5 Drawing Sheets

(51) Int. Cl.
    *H05K 3/28* (2006.01)
    *H05K 1/03* (2006.01)
    *H05K 1/09* (2006.01)

(52) U.S. Cl.
    CPC ............ *H05K 1/0326* (2013.01); *H05K 1/09* (2013.01); *H05K 1/095* (2013.01); *H05K 2201/0108* (2013.01); *H05K 2201/0145* (2013.01); *H05K 2201/0175* (2013.01); *H05K 2201/0191* (2013.01)

(58) Field of Classification Search
    CPC ........... H05K 1/095; H05K 2201/0108; H05K 2201/0145; H05K 2201/0175; H05K 2201/0191; H05K 3/4664; H05K 2201/0195; H05K 2201/0209; G06F 3/0445; G06F 3/0446; G06F 2203/04103
    See application file for complete search history.

(56) References Cited

U.S. PATENT DOCUMENTS

| 2017/0052643 | A1* | 2/2017 | Iwami .................. G09G 3/2003 |
| 2019/0377235 | A1 | 12/2019 | Takase et al. |

FOREIGN PATENT DOCUMENTS

| JP | 2010-86684 A | 4/2010 |
| JP | 2014-21522 A | 2/2014 |
| JP | 2015-97039 A | 5/2015 |
| JP | 2015-158840 A | 9/2015 |
| JP | 2017-211826 A | 11/2017 |
| KR | 10-2014-0074123 A | 6/2014 |

OTHER PUBLICATIONS

Written Opinion of the International Searching Authority, issued in PCT/JP2021/040014, PCT/ISA/237, dated Nov. 22, 2021.

* cited by examiner

WIRING BOARD

TECHNICAL FIELD

The present invention relates to a wiring substrate.

BACKGROUND ART

In recent years, touch panels have been used widely as input devices. A touch panel consists mainly of a display unit such as a liquid crystal panel and a touch panel sensor designed to detect information that is inputted at a specific position. By the method used to detect input positions, touch panels are roughly classified into resistive film type ones, capacitive type ones, optical type ones, electromagnetic induction type ones, ultrasonic type ones, and the like. In particular, capacitive type touch panels are widely used because of, for example, excellent design, simple structure, and high functionality.

A capacitive type touch panel sensor includes a first electrode and a second electrode that is orthogonal thereto with an insulating layer interposed in between. A voltage is applied to the electrodes in the touch panel surface, and when a change in electrostatic capacity caused by the touch of a conductive material such as finger is detected, the contact position is outputted as a signal. Touch panel sensors used in capacitive type panels have, for example, a structure in which electrodes and external connection terminals are formed on a pair of mutually opposed transparent substrates or a structure in which electrodes and external connection terminals are formed on both surfaces of a single transparent substrate.

As the wiring electrodes for touch panel sensors, transparent wiring electrodes have been used commonly in order to make the wiring electrodes less visible, but in recent years, opaque wiring electrodes made of metal materials have come in wider use as sensors with higher sensitivity and panels of larger size are becoming popular. Touch panel sensors having opaque wiring electrodes made of metal materials are disadvantageous in that the opaque wiring electrodes are visually recognized due to the metallic luster of the opaque wiring electrodes. As a method for make opaque wiring electrodes less visible, it is proposed to provide a light-shielding layer on the opaque wiring electrodes by first forming opaque wiring electrodes on a transparent substrate, then coating them with a black positive photosensitive composition, irradiating the positive photosensitive composition with light using the opaque wiring electrodes as a mask, and developing it (for example, see Patent document 1).

PRIOR ART DOCUMENTS

Patent Documents

Patent document 1: International Publication WO 2018/168325

SUMMARY OF INVENTION

Problems to be Solved by the Invention

However, even in the case where light-shielding layers are formed on the opaque wiring electrodes as described in Patent document 1 in order to suppress the metallic luster of the opaque wiring electrodes, the use of this technique alone cannot work sufficiently because the opaque wiring electrodes are still visible due to the difference in reflectance between the opaque wiring electrodes covered by the light-shielding layers and the transparent substrate.

Thus, the main object of the present invention is to provide a wiring substrate in which opaque wiring electrodes are hardly visible.

Means of Solving the Problems

As the main solution to the above problems, the present invention has the following constitution.

A wiring substrate including a transparent substrate, patterned opaque wiring electrodes formed on at least one surface of the transparent substrate, and a transparent protective layer formed on the transparent substrate and on the opaque wiring electrodes, the internal reflectance R1 of the wiring substrate at the position where an opaque wiring electrode is present being 0.1% or less as measured through the transparent protective layer, and the refractive index n1 of the transparent substrate and the refractive index n2 of the transparent protective layer satisfying the equation (1) given below:

$$0.97 \leq n2/n1 \leq 1.03 \tag{1}$$

Advantageous Effects of the Invention

The present invention can provide a wiring substrate in which opaque wiring electrodes are hardly visible.

DESCRIPTION OF PREFERRED EMBODIMENTS

Embodiments of the wiring substrate according to the present invention are described in detail below with reference to drawings. Here, the drawings are schematic. It should be noted that the present invention is not limited to the embodiments described below.

Figure 1:
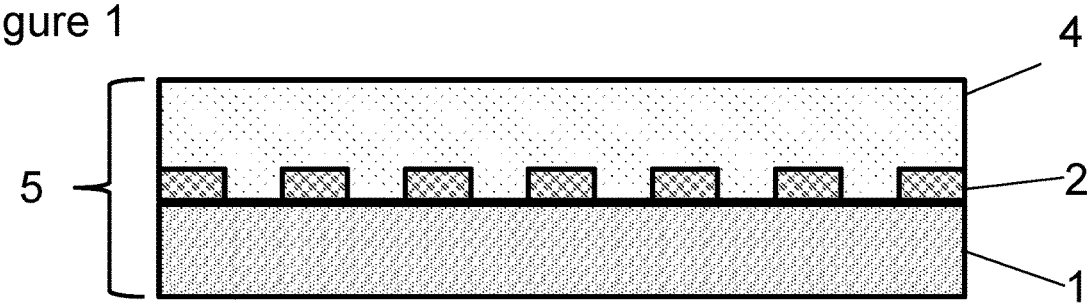
FIG. 1 This gives a schematic diagram of an example of the wiring substrate according to the present invention.

FIG. 1 gives a schematic diagram of an example of the wiring substrate 5 according to the present invention. The wiring substrate 5 has a transparent substrate 1, patterned opaque wiring electrodes 2 on at least one surface of the transparent substrate 1, and a transparent protective layer 4 formed on the transparent substrate 1 and the opaque wiring electrodes 2. Each of them will be described separately below.

<Transparent Substrate>

The transparent substrate is transparent in the visible light region. A transparent material as refers to herein is one having a transmittance of 80% or more at a wavelength of 550 nm. Here, the transmittance at a wavelength of 550 nm can be measured using an ultraviolet-visible spectrophotometer (U-3310, manufactured by Hitachi High-Technologies Corporation).

The transparent substrate is, for example, a transparent substrate that is not flexible or a transparent substrate that is flexible, Examples of the transparent substrate that is not flexible include quartz glass, soda glass, chemically strengthened glass, Pyrex (registered trademark) glass, synthetic quartz plate, epoxy resin substrate, polyetherimide resin substrate, polyetherketone resin substrate, and polysulfone resin substrate. Examples of the transparent substrate that is flexible include optical resin plates and transparent films of resin such as polyethylene terephthalate film (hereinafter referred to as PET film), cycloolefin polymer film, polyimide film, polyester film, and aramid film. A plurality of these may be used in a stacked form, and for example, a plurality of transparent substrates may be used in combination after adhering them using adhesive layers.

It is preferable for the surface of the transparent substrate to have an inorganic film with a thickness of 5 to 50 nm.

It is preferable for the inorganic film to be made of silicon dioxide, niobium pentoxide, or the like. If the transparent substrate has such an inorganic film thereon, it serves to enhance the contact between the transparent substrate and the transparent protective layer. If the inorganic film has a thickness of 50 nm or less, it serves to minimize the contribution of the inorganic film to reflection. It is more preferable for the inorganic film to have a thickness of 30 nm or less. On the other hand, it is preferable for the inorganic film to have a thickness of 5 nm or more from the viewpoint of ensuring good adhesion.

The transparent substrate may have any appropriate thickness depending on its material as long as it can support the opaque wiring electrodes stably and has a translucency as described above. For example, in order to ensure stable support of the opaque wiring electrodes, it is preferably 300 µm or more in the case of a transparent substrate of glass etc that is not flexible and 25 µm or more in the case of a transparent substrate of PET film etc, that is flexible. On the other hand, in order to ensure higher translucency for light used for irradiation, it is preferably 1,500 µm or less in the case of a transparent substrate of glass etc. that is not flexible and 300 µm or less in the case of a transparent substrate of PET film etc. that is flexible.

<Opaque Wiring Electrode>

Opaque wiring electrodes are patterned on at least one surface of the transparent substrate. An opaque material as refers to herein is one having a transmittance of 25% or less at a wavelength of 550 nm.

Useful materials for the opaque wiring electrodes include, for example, metals such as silver, gold, copper, platinum, lead, tin, nickel, aluminum, tungsten, molybdenum, chromium, titanium, and indium, as well as alloys thereof. Of these, silver, copper, and gold are preferable from the viewpoint of electric conductivity. Furthermore, the opaque wiring electrodes may be made of a cured product of an electrically conductive composition that contains electrically conductive particles. In this case, the electrically conductive particles preferably have a spherical shape and are made of metals or alloys as described above.

In order to allow the electrically conductive particles to have increased dispersibility, it is preferable for the electrically conductive particles to have an average particle diameter of 0.01 µm or more, more preferably 0.03 µm or more, still more preferably 0.05 µm or more, and still more preferably 0.10 µm or more. In addition, in order to allow the opaque wiring electrodes to have sharply patterned edges, it is preferably 1.5 µm or less, and more preferably 1.0 µm or less. Here, the average particle diameter of electrically conductive particles can be determined by using a scanning electron microscope (SEM) or a transmission electron microscope (TEM). They are observed at a magnification of 15,000 times, and the maximum diameters of randomly selected 100 electrically conductive particles are measured, followed by calculating their number average.

It is preferable for the electrically conductive composition to contain an alkali-soluble resin. If an alkali-soluble resin is included, fine opaque wiring electrodes can be formed when patterning is performed by development. Examples of the alkali-soluble resin include resin having a hydroxyl group and/or a carboxyl group.

Examples of such a resin having a hydroxyl group include novolac resins having a phenolic hydroxyl group such as such as phenol novolac resin and cresol novolac resin, polymers produced from a monomer having a hydroxyl group, and copolymers produced from a monomer having a hydroxyl group and styrene, acrylonitrile, acrylic monomer, etc.

Examples of such a monomer having a hydroxyl group include monomers having a phenolic hydroxyl group such as 4-hydroxystyrene and hydroxyphenyl (meth)acrylate and, monomers having a non-phenolic hydroxyl group such as 2-hydroxyethyl (meth)acrylate, 2-hydroxypropyl (meth)acrylate, 3-methyl-3-hydroxybutyl (meth)acrylate, 1,1-dimethyl-3-hydroxybutyl (meth)acrylate, 1,3-dimethyl-3-hydroxybutyl (meth)acrylate, 2,2,4-trimethyl-3-hydroxypentyl (meth)acrylate, 2-ethyl-3-hydroxyhexyl (meth)acrylate, glycerin mono(meth) acrylate, polypropylene glycol mono(meth)acrylate, and polyethylene glycol mono(meth)acrylate.

Examples of such a resin having a carboxyl group include carboxylic acid modified epoxy resin, carboxylic acid modified phenol resin, polyamic acid resin, carboxylic acid modified siloxane resin, polymers produced from a monomer having a carboxyl group, and copolymers produced from a monomer having carboxyl group and styrene, acrylonitrile, acrylic monomer, etc.

Examples of such a monomer having a carboxyl group include acrylic acid, methacrylic add, maleic add, fumaric acid, crotonic acid, itaconic acid, citraconic acid, and cinnamic acid.

Examples of such a resin having a hydroxyl group and a carboxyl group include copolymers produced from a monomer having a hydroxyl group and a monomer having a carboxyl group, and copolymers produced from a monomer having a hydroxyl group, a monomer having a carboxyl group, and styrene, acrylonitrile, acrylic monomer, etc. Two or more of these may be contained together.

Such an electrically conductive composition may contain a pigment and/or a dye. The use of an electrically conductive composition containing a pigment and/or a dye serves to suppress the metallic luster of the opaque wiring electrodes to make the opaque wiring electrodes less visible, thereby eliminating the need to additionally provide light-shielding layers as described below, Light-shielding layers may be formed additionally in order to suppress more strongly the metallic luster of the opaque wiring electrodes.

In the case where light-shielding layers are not added, the content of the pigment and/or dye is preferably 0.5 to 2.5 mass % in the electrically conductive composition. In order to suppress the metallic luster of the opaque wiring electrodes more strongly, the content of the pigment and/or dye is preferably 0.5 mass % or more. In order to ensure an increased electric conductivity, on the other hand, the content of the pigment and/or dye is preferably 2.5 or mass % or less.

Examples of such a pigment include lactam based pigments, perylene based pigments, phthalocyanine based pigments, isoindoline based pigments, diaminoanthraquinone based pigments, dioxazine based pigments, indanthrone based pigments, carbon black, and inorganic pigments.

Examples of such a dye include ferrocene based dyes, fluorenone based dyes, perylene based dyes, triphenyl methane based dyes, coumarin based dyes, diphenyl amine based dyes, quinacridone based dyes, quinophtharone based dyes, phthalocyanine based dyes, and xanthene based dyes.

It is preferable for the electrically conductive composition to be a photosensitive electrically conductive composition that further contains a photo initiator in addition to the electrically conductive particles and alkali-soluble resin described above. The use of a photosensitive electrically conductive composition serves to produce fine opaque wiring electrodes by photolithography.

Examples of such a photo initiator include 1,2-octanedione, 1-[4-(phenylthio)-2-(O-benzoyloxime)], 2,4,6-trimethylbenzoyl-diphenyl-phosphine oxide, bis(2,4,6-trimethylbenzoyl)-phenylphosphine oxide, ethanone, 1-[9-ethyl-6-2(2-methylbenzoyl)-9H-carbazole-3-yl]-1-(0-acetyloxime), benzophenone, methyl ortho-benzoylbenzoate, 4,4'-bis(dimethylamino)benzophenone, 4,4'-bis(diethylamino)benzophenone, 4,4'-dichlorobenzophenone, 4-benzoyl-4'-methyl diphenyl ketone, dibenzyl ketone, fluorenone, 2,2'-diethoxyacetophenone, 2,2-dimethoxy-2-phenyl acetophenone, 2-hydroxy-2-methyl propiophenone, p-t-butyl dichloroacetophenone, thioxanthone, 2-methyl thioxanthone, 2-chlorothioxanthone, 2-isopropyl thioxanthone, diethyl thioxanthone, benzyl, benzyl dimethyl ketal, benzyl-3-methoxyethyl acetal, benzoin, benzoin methyl ether, benzoin butyl ether, anthraquinone, 2-t-butyl anthraquinone, 2-amyl anthraquinone, 3-chloroanthraquinone, anthrone, benzanthrene, dibenzosuberone, methylene anthrone, 4-azide-benzalacetophenone, 2,6-bis(p-azide-benzylidene)cyclohexanone, 6-bis(p-azide-benzylidene)-4-methylcyclohexanone, 1-phenyl-1,2-butanedione-2-(o-methoxycarbonyl)oxime, 1-phenyl-propanedione-2-(o-ethoxycarbonyl)oxime, 1-phenyl-propanedione-2-(o-benzoyl)oxime, 1,3-diphenyl-propane trione-2-(o-ethoxycarbonyl)oxime, 1-phenyl-3-ethoxy-propane-trione-2-(o-benzoyl)oxime, Michler's ketone, 2-methyl-[4-(methylthio)phenyl]-2-morpholino-1-propanone, naphthalenesulfonyl chloride, quinolinesulfonyl chloride, N-phenyl thioacridone, 4,4'-azobisisobutyronitrile, diphenyldisulfide, benzthiazoledisulfide, triphenylphosphine, camphor quinone, 2,4-diethylthioxanthone, isopropylthioxanthone, carbon tetrabromide, tribromophenylsulfone, benzoin peroxide, eosin, and combinations of a photoreducing dye such as methylene blue and a reduction agent such as ascorbic acid and triethanol amine.

The electrically conductive composition may further contain a dispersing agent, a monomer having an unsaturated double bond, photoacid generating agent, thermal acid generating agent, sensitizing agent, contact improving agent, surface active agent, heat curing agent, polymerization inhibitor, etc., as required.

Examples of such a monomer having an unsaturated double bond include methyl acrylate, ethyl acrylate (hereinafter EA), acrylic acid (hereinafter AA), 2-ethylhexyl acrylate, n-butyl acrylate, i-butyl acrylate, i-propane acrylate, glycidyl acrylate, N-methoxymethyl acrylamide, N-ethoxymethyl acrylamide, N-n-butoxymethyl acrylamide, N-isobutoxymethyl acrylamide, butoxytriethylene glycol acrylate, dicyclopentanyl acrylate, dicyclopentenyl acrylate, 2-hydroxyethyl acrylate, isobornyl acrylate, 2-hydroxypropyl acrylate, isodecyl acrylate, isooctyl acrylate, lauryl acrylate, 2-methoxyethyl acrylate, methoxyethylene glycol acrylate, methoxydiethylene glycol acrylate, octafluoropentyl acrylate, phenoxyethyl acrylate, stearyl acrylate, trifluoroethyl acrylate, acrylamide, aminoethyl acrylate, phenyl acrylate, phenoxyethyl acrylate, 1-naphthyl acrylate, 2-naphthyl acrylate, thiophenol acrylate, benzyl mercaptan acrylate, allylated cyclohexyl diacrylate, 1,4-butanediol diacrylate, 1,3-butylene glycol diacrylate, ethylene glycol diacrylate, diethylene glycol diacrylate, triethylene glycol diacrylate, polyethylene glycol diacrylate, dipentaerythritol hexaacrylate, dipentaerythritol monohydroxypentaacrylate, ditrimethylolpropane tetraacrylate, glycerol diacrylate, methoxylated cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, bisphenol F diacrylate, diacrylate of bisphenol A-ethylene oxide addition product, diacrylate of bisphenol F-ethylene oxide addition product, diacrylate of bisphenol A-propylene oxide addition product, and compounds produced therefrom by substituting the acrylic group by a methacrylic group.

The opaque wiring electrodes have patterned shapes such as mesh-like and stripe-like. In particular, mesh-like shapes are preferable from the viewpoint of achieving a pattern that ensures a uniform electric conductivity. It is more preferable for the opaque wiring electrodes to be in the form of a metal mesh that is made of a metal as described above and has a mesh-like pattern. Such a mesh shape may be, for example, in the form of an aggregation of triangular, quadrangular, polygonal, or circular units or a lattice composed of a combination of these unit shapes.

From the viewpoint of visibility, the portions of area of containing opaque wiring electrodes preferably account for 20% or less, more preferably 15% or less, of the total area of the transparent substrate. Opaque wiring electrodes may be formed in two or more layers with transparent protective layers interposed in between. If opaque electrodes are formed in two layers, it serves to reduce the area of the portions that contain the opaque wiring electrodes.

From the viewpoint of electric conductivity, it is preferable for the opaque wiring electrodes to have a thickness of 0.01 µm or more, more preferably 0.05 µm or more, and still more preferably 0.1 µm or more. On the other hand, from the viewpoint of the formation of fine wiring, it is preferably for the opaque wiring electrodes to have a thickness of 10 μm or less, more preferably 5 μm or less, and still more preferably 3 μm or less.

It is preferable for the opaque wiring electrodes to have a line width of 1 to 10 μm. If the opaque wiring electrodes have a line width of 1 μm or more, it serves to increase the electric conductivity. The line width of the opaque wiring electrodes is more preferably 1.5 μm or more, and still more preferably 2 μm or more. On the other hand, if the opaque wiring electrodes have a line width of 10 μm or less, it serves to make the opaque wiring electrodes less visible. The line width of the opaque wiring electrodes is more preferably 7 μm or less, and still more preferably 6 μm or less. The line width of the opaque wiring electrodes can be measured using an optical microscope (VHX-6000, manufactured by Keyence Corporation).

<Light-Shielding Layer>

Figure 2:
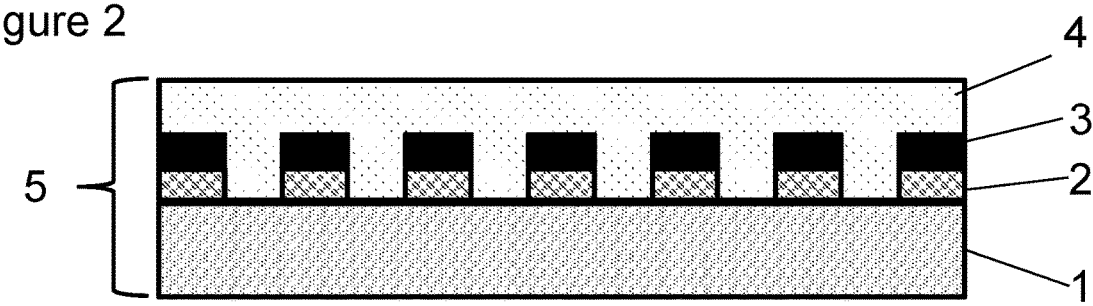
FIG. 2 This gives a schematic diagram of another example of the wiring substrate according to the present invention.

As shown in FIG. 2, it is preferable for each opaque wiring electrode 2 to have a light-shielding layer 3 thereon. If a light-shielding layer is present on a opaque wiring electrode, it serves to suppress the metallic luster of the opaque wiring electrode to make the opaque wiring electrode less visible. The light-shielding layer may be a black film of a sputtered alloy of nickel, titanium, copper, etc., a plated film, a cured film of a resin composition containing a black pigment, or the like. Of these, the use of a cured film of a resin composition containing a black pigment is preferable from the viewpoint of the suppression of reflection in the regions containing the opaque wiring electrodes. In addition, the light-shielding layers may have electric conductivity, and if the light-shielding layers have electric conductivity, it serves to increase the electric conductivity of the opaque wiring electrodes.

In the case of plating, it can be formed on the surfaces of the opaque wiring electrodes by, for example, bringing the opaque wiring electrodes into contact with an aqueous hydrochloric acid solution containing palladium, tellurium, and/or their compounds. It is preferable for the aqueous hydrochloric acid solution containing palladium, tellurium, and/or their compounds to have a pH of 3 or less and more preferably have a pH of 2 or less from the viewpoint of effective acceleration of plating through an oxidation-reduction reaction between the palladium and/or tellurium and the metal in the opaque wiring electrodes.

When the light-shielding layer is a cured film of a resin composition containing a black pigment, the resin composition may contain an alkali-soluble resin, dispersing agent, monomer having an unsaturated double bond, photo initiator, photoacid generating agent, thermal acid generating agent, sensitizing agent, contact improving agent, surface active agent, heat curing agent, polymerization inhibitor, leveling agent, etc. As these components, those listed above in the description of the opaque wiring electrodes may be used.

The resin composition containing a black pigment is preferably a positive type photosensitive resin composition that includes an alkali-soluble resin and a photoacid generating agent. Positive type photosensitivity as referred herein is the property of being liable to a change in the chemical structure caused by irradiation with active ray and becoming soluble in an alkali developer. If the resin composition containing a black pigment is a positive type photosensitive resin composition, light-shielding layers of the same pattern can be formed easy on opaque wiring electrodes by the method described later.

Examples of the photoacid generating agent include diazonium salt, diazoquinone sulfonic acid amide, diazoquinone sulfonic acid ester, diazoquinone sulfonate, nitrobenzyl ester, onium salt, halide, halogenated isocyanate, halogenated triazine, bisarylsulfonyl diazomethane, and disulfone.

Examples of the black pigment include organic pigments and inorganic pigments, and two or more of these pigments may be contained.

Examples of the organic pigments include soluble azo pigments, insoluble azo pigments, metal complex azo pigments, phthalocyanine pigments, and condensed polycyclic pigments.

Examples of the inorganic pigments include carbon black, graphite, burnt pine, and iron oxides such as iron black, hematite, goethite, and magnetite, as well as titanium, chromium, lead, and metal composites thereof. Of these, carbon black is preferable because of being high in light shieldability.

The black pigment preferably accounts for 5 to 30 mass % of the solid content in the resin composition. If the black pigment accounts for 5 mass % or more, it ensures a further increase in light shieldability. On the other hand, if the black pigment accounts for 30 mass % or less, it serves to increase the sensitivity to light irradiation to ensure an increased solubility. The content of the black pigment is more preferably 15 mass % or less. Solubility as referred to herein means the tendency of a light-irradiated portion to be dissolved in a developer, and a higher solubility suggests that the light-irradiated portion will be dissolved in a developer in a shorter period of time.

A light-shielding layer may be formed directly on an opaque wiring electrode or may be formed on an opaque wiring electrode with a transparent protective layer interposed in between.

<Transparent Protective Layer>

The transparent protective layer is transparent in the visible light region. Transparency is defined previously. Here, if the transparent protective layer is too thin to undergo measurement alone easily, a sample of the transparent protective layer may be formed on a plate of non-alkali glass AN Wizus (registered trademark) (manufactured by AGO) and subjected to transmittance measurement.

The transparent protective layer may have ion migration resistance and adhesiveness and may have a multilayer structure consisting of two or more identical or different type layers. In particular, it is preferably an insulation layer having ion migration resistance from the viewpoint of the prevention of short circuits from being caused by ion migration between mutually adjacent opaque wiring electrodes. Ion migration resistance as referred to herein means the resistance to short circuiting that can be caused by ion migration between two mutually electrically disconnected electrodes when a voltage is applied between a positive and a negative electric terminal that are connected to the electrodes.

Furthermore, if the transparent protective layer is an adhesive layer having adhesiveness, it can be adhered to a covering material such as cover glass and cover plastics.

If the transparent protective layer includes an insulation layer alone, it is impossible to adhere it to a covering material, whereas if it includes an adhesive layer alone, short circuiting may occur easily due to ion migration. However, both ion migration resistance and adhesiveness are ensured if an insulation layer and an adhesive layer are formed in this order on a transparent base. If two or more opaque wiring electrode layers are formed with transparent protective layers interposed in between, it is preferable from the viewpoint of ion migration resistance to stack the same number of insulation layers as the opaque wiring electrodes. In the case where two opaque wiring electrode layers are formed with a transparent protective layer interposed in between, it is preferable to stack an insulation layer, an insulation layer, and an adhesive layer formed in this order on a transparent base.

In particular, it is preferable that two or more transparent protective layers be stacked, that at least one of the transparent protective layers be an insulation layer having ion migration resistance, that at least another layer be an adhesive layer having adhesiveness, that the transparent substrate, the insulation layer, and the adhesive layer be stacked in this order, and that the refractive index n2a of the insulation layer and the refractive index n2b of the adhesive layer satisfy the equation (2) given below:

$$0.97 \leq n2a/n2b \leq 1.03 \quad (2).$$

If the equation (2) given above is satisfied, it serves to suppress the reflectance more strongly.

If a layer having ion migration resistance is to be adopted, it is preferable to use, for example, an insulating resin material such as polyimide resin, acrylic resin, cards resin, epoxy resin, melamine resin, urethane resin, silicone based resin, and fluorine based resin, or an inorganic material such as glass. Two or more of these may be used in combination. In particular, it is preferable to adopt an insulating resin material from the viewpoint of the strength against deflection and bending of the transparent substrate.

If it a layer having adhesiveness is to be adopted, good materials that can be used suitably include, for example, acrylic resin, silicone resin, urethane resin, polyimide resin, polyvinyl ether resin, vinyl acetate/vinyl chloride copolymer, modified polyolefin resin, fluorine based resin, natural rubber, and synthetic rubber. Two or more of these may be used in combination.

The transparent protective layer having adhesiveness may be a commercial product, and examples of such a commercial product include transparent adhesive films such as LUCIACS (registered trademark) CS9867US, LUCIACS (registered trademark) CS9824T, and LUCIACS (registered trademark) CS9827US (all manufactured by Nitto Denko Corporation).

The transparent protective layer may be formed from a transparent resin composition on the transparent substrate and on the opaque wiring electrodes according to the transparent protective layer formation method described later. The transparent resin composition may contain an alkali-soluble resin, dispersing agent, monomer having an unsaturated double bond, photo initiator, photoacid generating agent, thermal acid generating agent, sensitizing agent, contact improving agent, surface active agent, heat curing agent, polymerization inhibitor, leveling agent, etc. In particular, it is preferable to include an alkali-soluble resin and a photo initiator to develop photosensitivity. As these components, those listed above in the description of the opaque wiring electrodes may be used.

<Wiring Substrate>

For the wiring substrate according to the present invention, the internal reflectance R1 in the regions containing opaque wiring electrodes is 0.1% or less, and preferably 0.01% or more and 0.1% or less, as measured through the transparent protective layer. If this feature is maintained, it serves to suppress the metallic luster of the opaque wiring electrodes to make the opaque wiring electrodes less visible.

Figure 3:
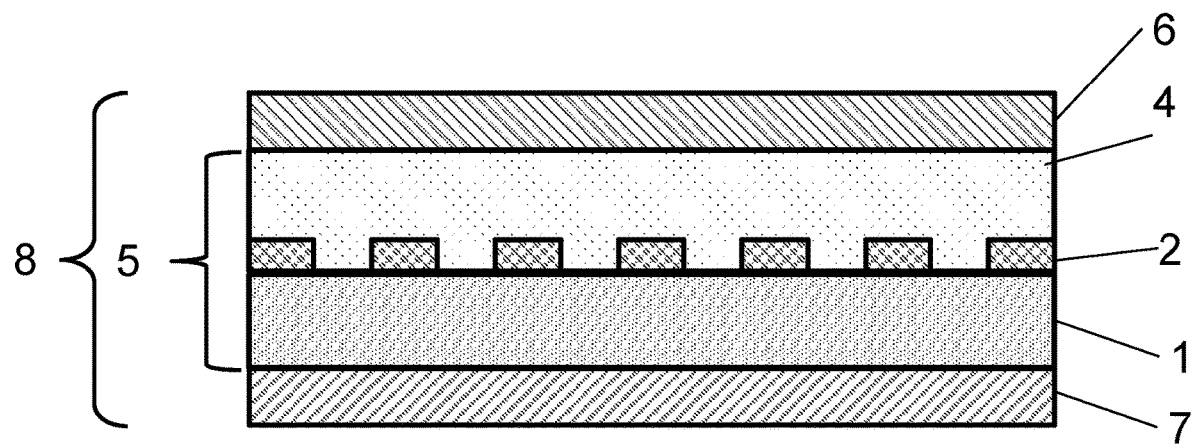
FIG. 3 This gives a schematic diagram of a region that is located in a first substrate for reflectance evaluation and that includes opaque wiring electrodes.
Figure 4:
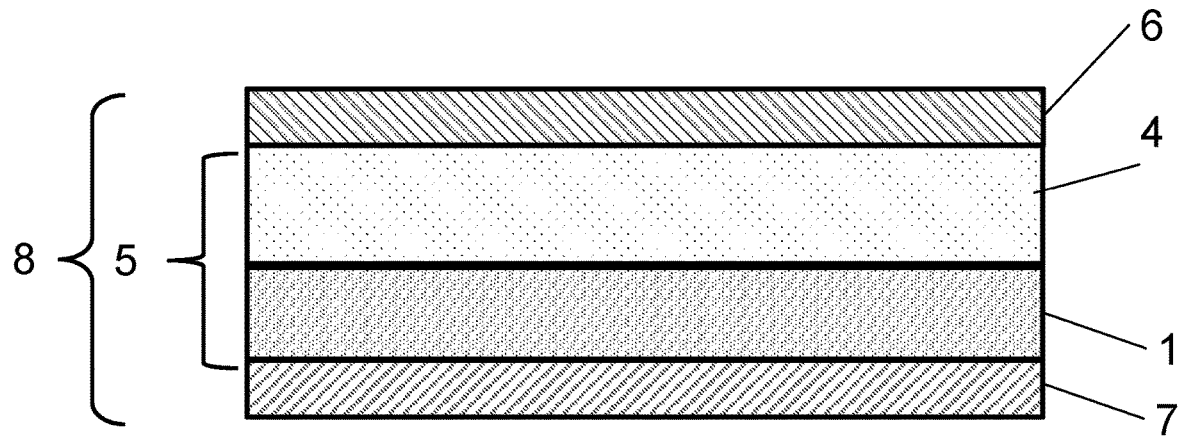
FIG. 4 This gives a schematic diagram of a region that is located in a first substrate for reflectance evaluation and that includes no opaque wiring electrodes.

Here, the internal reflectance R1 can be determined as described below. First, a first substrate for reflectance evaluation is prepared as illustrated in FIG. 3, in which an antireflection film 6 is attached to the surface of the transparent protective layer 4 in a wiring substrate 5 while a black film 7 is attached to the surface of the transparent substrate 1 in order to reduce the reflection at the interface between the transparent protective layer 4 and air and that at the interface between the transparent substrate 1 and air. Then, for the regions containing the opaque wiring electrodes in the first substrate for reflectance evaluation 8, the reflectance R3 is measured through the transparent protective layer 4. Subsequently, as illustrated in FIG. 4, the reflectance R4 is measured in the same way for the region containing no opaque wiring electrode in the first substrate for reflectance evaluation 8. From the measurements of R3 and R4, the difference R3-R4 is calculated to give the internal reflectance R1. If the internal reflectance R1 is calculated in this way, it serves to determine the internal reflectance R1 with little error because this can reduce the influence of the reflectance at the interface between the transparent protective layer 4 and air and that at the interface between the transparent substrate 1 and air even when they are significantly large. These reflectance values can be measured by using a spectrophotometer.

Figure 9:
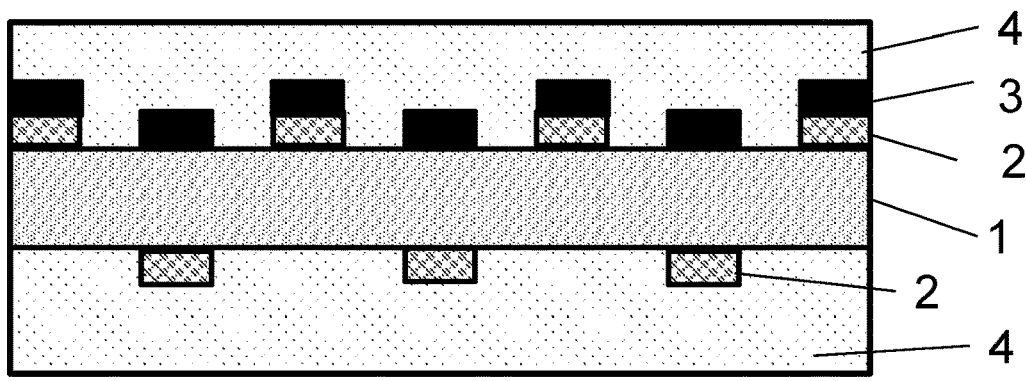
FIG. 9 This gives a schematic diagram of another example of the wiring substrate according to the present invention, FIG. 10 This gives a schematic diagram of a mask used in Examples.

Here, in the case of a wiring substrate according to the undermentioned embodiment as illustrated in FIG. 9, where opaque wiring electrode layers and transparent protective layers are present on both surfaces of a transparent substrate and where the internal reflectance values in the regions containing opaque wiring electrodes measured through the two transparent protective layers differ from each other, determination of the internal reflectance R1 can be made possible if a first substrate for reflectance evaluation is prepared by attaching an antireflection film 6 to the surface of either transparent protective layer 4 that has a smaller reflectance R3 and attaching a black film 7 to the surface of the other transparent protective layer 4.

Available methods for reducing the internal reflectance R1 to below 0.1% include the method of adding a pigment and/or a dye to the opaque wiring electrodes and the method of providing light-shielding layers on the opaque wiring electrodes.

The wiring substrate according to the present invention satisfies the equation (1) given below for the refractive index n1 of the transparent substrate and the refractive index n2 of the transparent protective layer. If the refractive index n1 and the refractive index n2 satisfy the equation (1) given below, it serves to make opaque wiring electrodes less visible by suppressing the reflection at the interface between the transparent protective layer and the transparent substrate to reduce the difference between this reflection and the reflection in the regions containing the opaque wiring electrodes.

$$0.97 \leq n2/n1 \leq 1.03 \quad (1)$$

The refractive index n1 of the transparent substrate and the refractive index n2 of the transparent protective layer can be determined by taking refractive index measurements at the wavelength of 550 nm using a prism coupler (PC-2000, manufactured by Metricon). Here, if the transparent protective layer is too thin to undergo measurement alone easily, it can be determined by forming a sample of the transparent protective layer on a silicone wafer and measuring the refractive index of the transparent protective layer sample on the silicone wafer. In the case where two or more transparent protective layers are stacked, the refractive index of the transparent protective layer that is in contact with the transparent substrate is adopted as n2.

The ratio R1:R2 of the aforementioned value R1 to the reflectance R2 at the interface between the transparent protective layer and the transparent substrate is preferably in the range of 1:3 to 3:1. If R1 is so large that the ratio R1:R2 is higher than 1:3, the opaque wiring electrodes appear darker so that the opaque wiring electrodes are prevented more effectively from becoming visible. On the other hand, if R2 is so large that the ratio R1:R2 is higher than 3:1, the opaque wiring electrodes appear brighter so that the opaque wiring electrodes are prevented more effectively from becoming visible. It is more preferable for the ratio R1:R2 to be in the range of 1:2 to 2:1.

Figure 5:
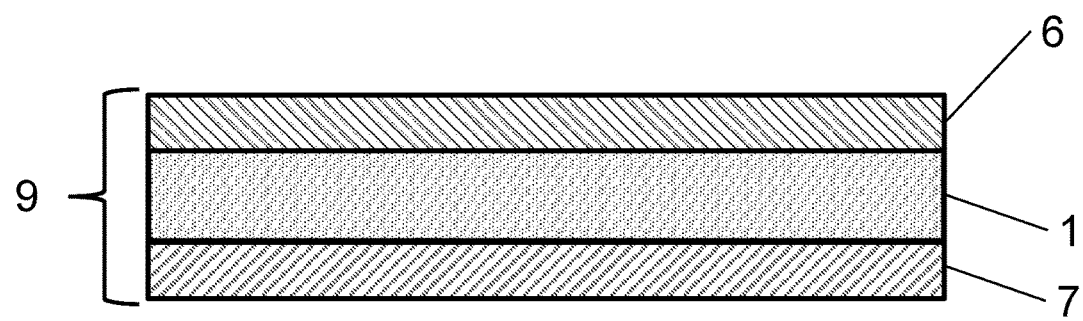
FIG. 5 This gives a schematic diagram of a second substrate for reflectance evaluation.

Here, the reflectance R2 can be calculated as described below. First, a second substrate for reflectance evaluation 9 is prepared as illustrated in FIG. 5, in which an antireflection film 6 is attached to one surface of a transparent substrate 1 and a black film 7 is attached to the other surface of the transparent substrate 1 in order to reduce the reflection at the interface between each surface of the transparent substrate 1 and air. Then, for the second substrate for reflectance evaluation 9, the reflectance R5 is measured through the antireflection film 6. The difference R4-R5 between the measured reflectance R5 and the aforementioned reflectance R4 is calculated, and this value is adopted to represent the reflectance R2 at the interface between the transparent protective layer and the transparent substrate. If the reflectance R2 is calculated in this way, it serves to determine the reflectance R2 with little error because this can reduce the influence of the reflectance at the interface between the transparent protective layer 4 and air and that at the interface between the transparent substrate 1 and air even when they are significantly large.

The ion migration resistance of a wiring substrate can be evaluated by, for example, the method described below. First, as described in FIG. 13, an opaque wiring electrode pattern having a line width of 10 μm and a line space of 10 μm is formed and then a transparent protective layer is formed on the wiring portion of the opaque wiring electrodes to prepare a substrate for ion migration resistance evaluation. A positive and a negative electric terminal are connected to the terminal portions of the resulting substrate for ion migration resistance evaluation and it is immersed in a constant temperature and humidity tank maintained at 85° C. and 85 RH % while applying a 5 V direct current and observing the changes in electric resistance. The time at which the electric resistance decreases to 15,630Ω is defined as the short circuiting time. In the evaluation, a sample with a shorter short circuiting time is assessed as lower in ion migration resistance and a sample with a longer short circuiting time is assessed as higher in ion migration resistance.

FIGS. 6 to 9 and FIG. 12 give schematic diagrams of other examples of the wiring substrate according to the present invention.

Figure 6:
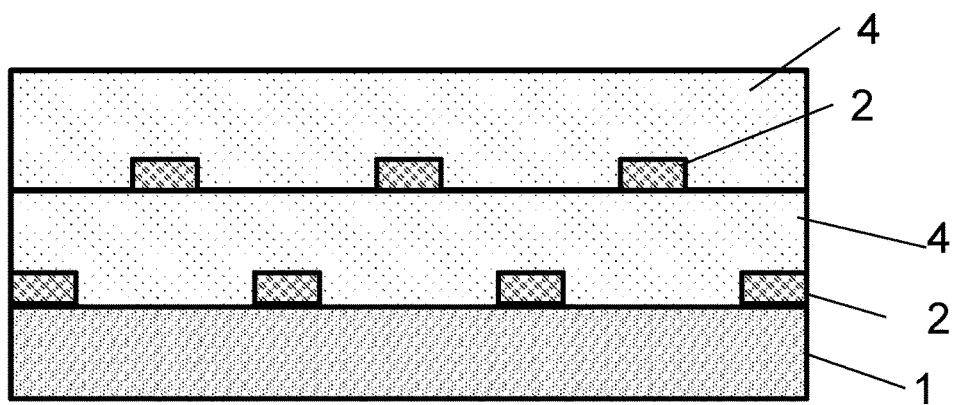
FIG. 6 This gives a schematic diagram of another example of the wiring substrate according to the present invention.

FIG. 6 gives a schematic diagram of a wiring substrate including a transparent substrate 1, first opaque wiring electrodes 2 disposed thereon, a first transparent protective layer 4 disposed on the first opaque wiring electrodes 2, and second opaque wiring electrodes 2 and a second transparent protective layer 4 disposed on the first transparent protective layer 4.

Figure 7:
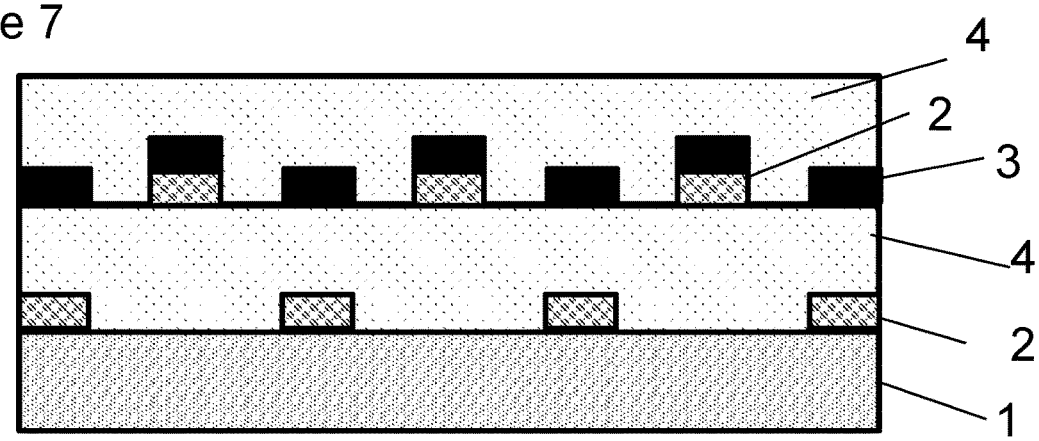
FIG. 7 This gives a schematic diagram of another example of the wiring substrate according to the present invention.

FIG. 7 gives a schematic diagram of a wiring substrate including a transparent substrate 1, first opaque wiring electrodes 2 disposed thereon, a first transparent protective layer 4 disposed on the first opaque wiring electrodes 2, second opaque wiring electrodes 2 disposed on the first transparent protective layer 4, and light-shielding layers 3 and a second transparent protective layer 4 disposed on the second opaque wiring electrodes 2.

Figure 8:
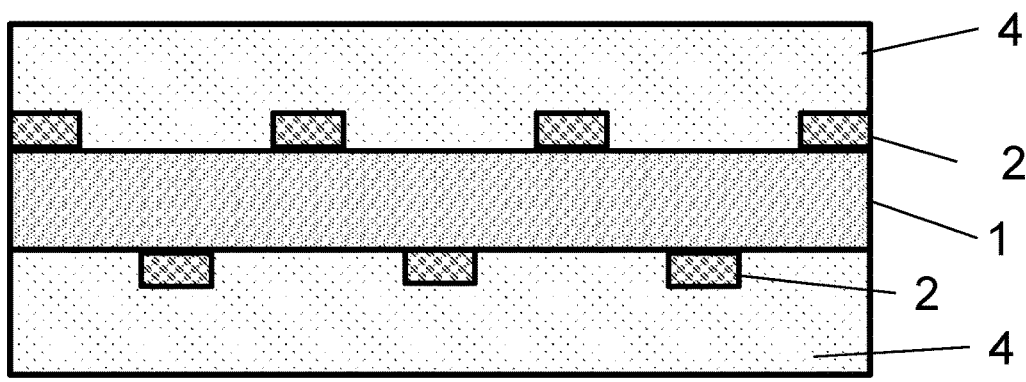
FIG. 8 This gives a schematic diagram of another example of the wiring substrate according to the present invention.

FIG. 8 gives a schematic diagram of a wiring substrate including a transparent substrate 1, opaque wiring electrodes 2 disposed on both surfaces thereof, and transparent protective layers 4 disposed on the opaque wiring electrodes 2 on both surfaces of the transparent substrate 1.

FIG. 9 gives a schematic diagram of a wiring substrate including a transparent substrate 1, opaque wiring electrodes 2 disposed on both surfaces thereof, light-shielding layers 3 disposed on the opaque wiring electrodes 2 on one surface thereof, and transparent protective layers 4 disposed on the opaque wiring electrodes 2 and the light-shielding layers 3 on both surfaces of the transparent substrate 1.

Figure 12:
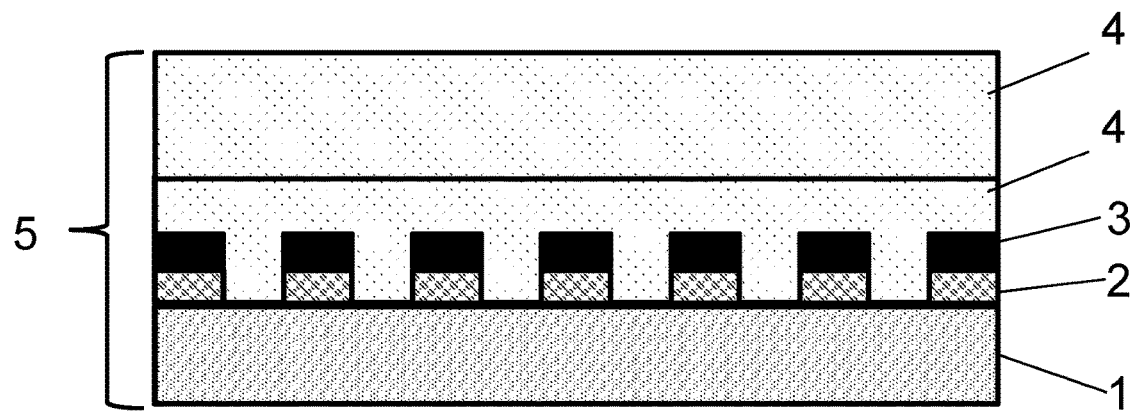
FIG. 12 This gives a schematic diagram of another example of the wiring substrate according to the present invention.

FIG. 12 gives a schematic diagram of a wiring substrate including a transparent substrate 1, opaque wiring electrodes 2 disposed on one surface thereof, a first transparent protective layer 4 disposed on the opaque wiring electrodes 2, and a second transparent protective layer 4 disposed on the first transparent protective layer 4.

<Method for Producing a Wiring Substrate>

Described next is the method for producing the wiring substrate according to the present invention.

First, opaque wiring electrodes are formed on at least one surface of a transparent substrate. These opaque wiring electrodes may be formed on both surfaces of a transparent substrate. Here, the process for forming opaque wiring electrodes on at least one surface of a transparent substrate may include a step for forming first opaque wiring electrodes on one surface of a transparent substrate, a step for forming a transparent protective layer on the first opaque wiring electrodes, and a step for forming second opaque wiring electrodes on the transparent protective layer.

Available methods for forming opaque wiring electrodes include, for example, a method designed to perform pattern formation by photolithography using a photosensitive electrically conductive composition as described above, a method designed to perform pattern formation by screen printing, gravure printing, ink jet printing, etc., using an electrically conductive composition (electrically conductive paste), and a method designed to first form a film of a metal, metal composite, metal-metal compound composite, metal alloy, etc., and perform pattern formation by photolithography using a resist. In particular, the use of a method designed to perform pattern formation by photolithography using a photosensitive electrically conductive composition is preferable because it can serve to produce fine wiring. Here, when opaque wiring electrodes are to be formed on both surfaces of a transparent substrate or when two or more opaque wiring electrode layers are to be formed with transparent protective layers interposed in between, the opaque wiring electrodes may be formed either by the same method or by different methods in combination.

Such a method that performs pattern formation by photolithography using a photosensitive electrically conductive composition includes a coating step for coating a transparent substrate with a photosensitive electrically conductive composition to form a coating film, a photolithography step for performing light irradiation and development of the coating film to form a pattern, and a curing step for heating the pattern at 100° C. to 300° C. to produce an electrically conductive pattern.

In the coating step, a photosensitive electrically conductive composition as described above is spread over a transparent substrate to form a coating film. Good methods for spreading a photosensitive electrically conductive composition over a transparent substrate include, for example, spin coating with a spinner, spray coating, roll coating, screen printing, and the use of a slit coater, blade coater, die coater, calendar coater, meniscus coater, or bar coater.

If the photosensitive electrically conductive composition contains a solvent, the resulting coating film may be dried to remove the solvent. Good methods for drying the coating film include, for example, heat drying by an oven, hot plate, or infrared ray irradiation, and vacuum drying. Heat drying is generally performed at a temperature of 50° C. to 120° C. for a heat drying time of 1 minute to several hours.

In the photolithography step, the coating film prepared in the coating step is irradiated with light and developed to form a pattern. Preferable light sources for the light irradiation of a coating film include the i-line (365 nm), h-line (405 nm), and g-line (436 nm) of a mercury lamp or LED lamp. Light is applied through a light irradiation mask to the surface of the transparent substrate that is coated with a photosensitive electrically conductive composition, and then non-irradiated portions are removed with a developer to produce an electrically conductive pattern.

Examples of useful developers to perform alkali development include aqueous solutions of tetramethyl ammonium hydroxide, diethanol amine, diethyl aminoethanol, sodium hydroxide, potassium hydroxide, sodium carbonate, potassium carbonate, triethyl amine, diethyl amine, methyl amine, dimethyl amine, dimethylaminoethyl acetate, dimethylaminoethanol, dimethylaminoethyl methacrylate, cyclohexyl amine, ethylene diamine, and hexamethylene diamine, and these aqueous solutions may contain polar solvents such as N-methyl-2-pyrrolidone, N,N-dimethyl formamide, N,N-dimethyl acetamide, dimethyl sulfoxide, and γ-butyrolactone, alcohols such as methanol, ethanol, and isopropanol, esters such as ethyl lactate and propylene glycol monomethyl ether acetate, and ketones such as cyclopentanone, cyclohexanone, isobutyl ketone, and methylisobutyl ketone, as well as surface active agents.

Examples of useful developers for organic development include polar solvents such as N-methyl-2-pyrrolidone, N-acetyl-2-pyrrolidone, N,N-dimethyl acetamide, N, N-dimethyl formamide, dimethyl sulfoxide, hexamethylphosphoric riamide, and mixed solutions of these polar solvents with methanol, ethanol, isopropyl alcohol, xylene, water, methyl carbitol, or ethyl carbitol.

Good development methods include, for example, the technique of spraying a developer over the surface of a coated film on a stationary or rotating substrate, the technique of immersing a substrate in a developer, and the technique of applying ultrasonic waves to a substrate immersed in a developer.

The pattern formed in the development step may be rinsed with a rinsing liquid. Examples of such a rinsing liquid include water and aqueous solutions prepared by adding alcohols such as ethanol and isopropyl alcohol, esters such as ethyl lactate and propylene glycol monomethyl ether acetate, or surface active agents to water.

In the case of opaque wiring electrodes having light-shielding layers thereon, light-shielding layers having the same pattern as the opaque wiring electrodes can be formed by first forming opaque wiring electrodes on a transparent base, coating them with a positive type photosensitive resin composition containing a black pigment, then irradiating the positive type photosensitive resin composition containing a black pigment with light applied through the opposite uncoated surface utilizing the opaque wiring electrodes as mask, followed by carrying out development. In the case where a light-shielding layer has to be removed from particular portions, such as terminal portions, to expose the opaque wiring electrode in order to provide electric connection to external devices, it may be good to add a step, as required, for applying light to the surface coated with the positive type photosensitive resin composition using a light irradiation mask.

The process for producing the light-shielding layers may include a curing step. The curing temperature is preferably 100° C. to 300° C. Good curing techniques include, for example, heat drying by an oven, inert oven, or hot plate, heat drying by an infrared ray heater or other electromagnetic wave generation devices, and vacuum drying.

Next, a transparent protective layer is formed on the transparent substrate and opaque wiring electrodes.

Good methods for forming a transparent protective layer include, for example, the technique of spreading and subsequently drying a transparent resin composition and the technique of attaching a transparent adhesive film to the surface having opaque wiring electrodes thereon.

Good methods for spreading a transparent resin composition include, for example, spin coating with a spinner, spray coating, roll coating, screen printing, offset printing, gravure printing, typographic printing, flexographic printing, and the use of a blade coater, die coater, calendar coater, meniscus coater, or bar coater.

When the technique of spreading and subsequently drying a transparent resin composition is adopted, the dried film may be cured by ultraviolet ray treatment and/or heat treatment. The transparent resin composition may have photosensitivity. In the case where a transparent protective layer has to be removed from particular portions, such as terminal portions, to expose the opaque wiring electrode in order to provide electric connection to external devices, it may be good to adopt a photolithography step for its removal as in the case of the photosensitive electric conductive composition.

EXAMPLES

The present invention will now be illustrated in detail with reference to examples and comparative examples, but the invention should not be construed as being limited thereto.

The materials used in each example and comparative example are as described below. Here, the transmittance of a transparent substrate at a wavelength of 550 nm was measured using an ultraviolet-visible spectrophotometer (U-3310, manufactured by Hitachi High-Technologies Corporation). The refractive index at a wavelength of 550 nm was measured using a prism coupler (PC-2000, manufactured by Metricon) at room temperature of 23° C.

(Transparent Substrate)
    Soda glass (thickness 1.1 mm, transmittance 90% at wavelength 550 nm, refractive index 1.52 at wavelength 550 nm) (a-1)
    TORMED TYPE S (manufactured by I.S.T.) (thickness 25 μm, transmittance 87% at wavelength 550 nm, refractive index 1.68 at wavelength 550 nm) (a-2)

(Monomer)
    Light Acrylate (registered trademark) HPP-A (manufactured by Kyoeisha Chemical Co., Ltd.), Light Acrylate (registered trademark) BP-4EAL (manufactured by Kyoeisha Chemical Co., Ltd.), LightAcrylate (registered trademark) BP-4PA (manufactured by Kyoeisha Chemical Co., Ltd.), LightAcrylate (registered trademark) BP-4EA (manufactured by Kyoeisha Chemical Co., Ltd.)

(Epoxy Resin)
    CG-500 (manufactured by Osaka Gas Chemicals Co., Ltd.)

(Photo Initiator)
N-1919 (manufactured by Adeka Corporation)
(Carbon Black)
MA100 (manufactured by Mitsubishi Chemical Corporation)
(Zirconia Dispersion Liquid)
Zircostar (registered trademark) ZP-153 (manufactured by Nippon Shokubai Co., Ltd.)
(Solvent)
PGMEA (manufactured by Kuraray Co., Ltd.)
(Antireflection Film)
MTAR-3 (manufactured by MeCan Imaging Inc.)
(Black Film)
Black PET film with adhesive agent Kukkiri Mie u (manufactured by Tomoegawa Co., Ltd.)
(Transparent Adhesive Film)
LUCIACS (registered trademark) CS9867US (manufactured by Nitto Denko Corporation) (thickness 175 μm, transmittance 92% at wavelength 550 nm, refractive index 1.48 at wavelength 550 nm) (b-1)
(Pet Film)
Lumirror (registered trademark) T60 (manufactured by Toray Industries, Inc.)
(Particles with High Refractive Index)
Epostar (registered trademark) MS (manufactured by Nippon Shokubai Co., Ltd.)
(Release Film)
Cerapeel (registered trademark) (thickness 38 μm, manufactured by Toray Advanced Film Co., Ltd.)

Production Example 1: Acrylic Copolymer Containing Carboxyl Group (C-1)

In a reaction vessel having a nitrogen atmosphere, 150 g of diethylene glycol monoethyl ether acetate (hereinafter referred to as DMEA) was fed and heated to 80° C. using an oil bath. To this liquid, a mixture of 20 g of EA, 40 g of 2-ethylhexyl methacrylate (hereinafter referred to as 2-EHMA), 20 g of styrene (hereinafter referred to as St), 15 g of AA, 0.8 g of 2,2'-azobisisobutyronitrile, and 10 g of DMEA was added dropwise over 1 hour. After the end of dropping, the polymerization reaction was continued for additional 6 hours. Then, 1 g of hydroquinone monomethyl ether was added to stop the polymerization reaction. Following this, a mixture of 5 g of glycidyl methacrylate (hereinafter referred to as GMA), 1 g of triethylbenzyl ammonium chloride, and 10 g of DMEA was added dropwise over 0.5 hour. After the end of dropping, the polymerization reaction was continued for additional 2 hours. The resulting reaction solution was purified with methanol to remove unreacted impurities and vacuum-dried for 24 hours to provide a carboxy group-containing acrylic copolymer (C-1) with a copolymerization ratio (by mass) EA/2-EHMA/St/GMA/AA of 20/40/20/5/15.

Production Example 2: Acrylic Copolymer Containing Carboxyl Group (C-2)

Except for using 10 g mass, instead of 20 g mass, of styrene, the same procedure as in Production example 1 was carried out to produce a carboxy group-containing acrylic copolymer (C-2) with a copolymerization ratio (by mass) EA/2-EHMA/St/GMA/AA of 20/40/10/5/15.

Production Example 3: Photosensitive Electrically Conductive Paste (D-1)

In a 100 mL clean bottle, 3.0 g of the carboxyl group-containing acrylic copolymer (C-1) prepared in Production example 1, 0.3 g of photo initiator N-1919, 1.2 g of monomer Light Acrylate (registered trademark) BP-4EA, 0.5 g of dispersing agent BYK-LP21116 (manufactured by BYK-Chemie), 79.0 g of PGMEA, 0.7 g of MA100, and 15.3 g of fine silver particles having a surface carbon coat layer with an average thickness of 1 nm and having a particle diameter of 40 nm (manufactured by Nisshin Engineering Inc.) were fed and mixed using a rotation-revolution type vacuum mixer (Awatori Rentaro ARE-310, manufactured by Thinky Corporation) to provide 100.0 g of a photosensitive electrically conductive paste (D-1).

Production Example 4: Photosensitive Electrically Conductive Paste (D-2)

Except for using 2.4 g weight, instead of 0.7 g weight, of MA100 and 13.6 g mass, instead of 15.3 g mass, of fine silver particles, the same procedure as in Production example 3 was carried out to produce 100.0 g of a photosensitive electrically conductive paste (D-2).

Production Example 5: Quinone Diazide Compound

In a dry nitrogen flow, 21.22 g (0.05 mole) of α,α,-bis(4-hydroxyphenyl)-4-(4-hydroxy-α,α-dimethyldimethylbenzylethyl benzene (trade name TrisP-PA, manufactured by Honshu Chemical Industry Co., Ltd.) and 33.58 g (0.125 mole) of 5-naphthoquinone diazide sulfonyl acid chloride were dissolved in 450 g of 1,4-dioxane and maintained at room temperature. To this solution, a mixture of 15.18 g of triethyl amine with 50 g of 1,4-dioxane was added dropwise while maintaining the system below 35° C. After the end of dropping, stirring was performed at 30° C. for 2 hours. The resulting triethylamine salt was filtered and the filtrate was poured in water. Then, the precipitate deposited was collected by filtration. The resulting precipitate was dried in a vacuum dryer to provide a quinone diazide compound.

Production Example 6: Light-Shielding Paste

In a 100 mL clean bottle, 3.1 g of WR-101 (manufactured by DIC), 0.8 g of the quinone diazide compound prepared in Production example 5, and 40.1 g of PGMEA were fed and mixed using a rotation-revolution type vacuum mixer (Awatori Rentaro ARE-310) to provide 44.0 g of a resin solution. A mixture prepared by mixing 44.0 g of the resulting resin solution, 0.6 g of MA100, 0.2 g of the acrylic copolymer (C-1), and 0.4 g of BYK-LP21116 was kneaded in Ultra Apex Mill (manufactured by Kotobuki Industry Co., Ltd.) equipped with a centrifugal separator that was 70 vol % filled with zirconia beads with a diameter of 0.05 mm (manufactured by Toray Industries, Inc.) to provide 45.2 g of a light-shielding paste.

Production Example 7: Aqueous Solution for Blackening Electrodes

A 25.0 g amount of 36 mass % hydrochloric acid and 0.5 g of tellurium dioxide were mixed in water and, after complete dissolution of tellurium dioxide, 10.0 g of acetic acid and 64.5 g of water were added, followed by mixing them to provide 100.0 g of an aqueous solution with a pH of 0 designed to blacken electrodes. Here, the pH value was measured using a pH meter (AP-20, manufactured by A&D Company, Limited) at a temperature of 25° C.

Production Example 8: Photosensitive Insulation Paste (E-1)

In a 100 mL clean bottle, 15.5 g of the acrylic copolymer (C-2), 5.2 g of Light Acrylate (registered trademark) HPP-A, 0.3 g of photo initiator N-1919, and 79.0 g of PGMEA were fed and mixed using a rotation-revolution type vacuum mixer (Awatori Rentaro ARE-310) to provide 100.0 g of a photosensitive insulation paste (E-1). The resulting photosensitive insulation paste (E-1) was spread over a 4 inch silicone wafer and the refractive index at a wavelength of 550 nm was measured at room temperature of 23° C. using a prism coupler (PC-2000, manufactured by Metricon). Results showed that it was 1.50.

Production Example 9: Photosensitive Insulation Paste (E-2)

Except for using 5.2 g of Light Acrylate (registered trademark) BP-4EAL instead of 5.2 g of Light Acrylate (registered trademark) HPP-A, the same procedure as in Production example 8 was carried out to provide 100.0 g of a photosensitive insulation paste (E-2). The resulting photosensitive insulation paste (E-2) was spread over a 4 inch silicone wafer and the refractive index at a wavelength of 550 nm was measured at room temperature of 23° C. using a prism coupler (PC-2000, manufactured by Metricon), Results showed that it was 1.53.

Production Example 10: Photosensitive Insulation Paste (E-3)

Except for using 15.5 g of the acrylic copolymer (C-1) instead of 15.5 g of the acrylic copolymer (C-2), the same procedure as in Production example 9 was carried out to provide 100.0 g of a photosensitive insulation paste (E-3). The resulting photosensitive insulation paste (E-3) was spread over a 4 inch silicone wafer and the refractive index at a wavelength of 550 nm was measured at room temperature of 23° C. using a prism coupler (PC-2000, manufactured by Metricon). Results showed that it was 1.55.

Production Example 11: Photosensitive Insulation Paste (E-4)

In a 100 mL clean bottle, 12.4 g of the acrylic copolymer (C-1), 4.1 g of Light Acrylate (registered trademark) BP-4EAL, 4.1 g of CG-500, 0.3 g of photo initiator N-1919, and 79.0 g of PGMEA were fed and mixed using a rotation-revolution type vacuum mixer (Awatori Rentaro ARE-310) to provide 100.0 g of a photosensitive insulation paste (E-4). The resulting photosensitive insulation paste (E-4) was spread over a 4 inch silicone wafer and the refractive index at a wavelength of 550 nm was measured at room temperature of 23° C. using a prism coupler (PC-2000, manufactured by Metricon), Results showed that it was 1.58.

Production Example 13: Photosensitive Insulation Paste (E-5)

Except for using 10.4 g mass of the acrylic copolymer (C-1), 2.1 g mass of BP-4EAL, and 8.3 g mass of CG-500, the same procedure as in Production example 12 was carried out to provide 100.0 g of a photosensitive insulation paste (E-5). The resulting photosensitive insulation paste (E-5) was spread over a 4 inch silicone wafer and the refractive index at a wavelength of 550 nm was measured at room temperature of 23° C. using a prism coupler (PC-2000, manufactured by Metricon). Results showed that it was 1.61.

Production Example 11: Photosensitive Insulation Paste (E-6)

In a 100 mL clean bottle, 7.3 g of the acrylic copolymer (C-1), 1.5 g of Light Acrylate (registered trademark) BP-4EAL, 5.9 g of CG-500, 0.3 g of photo initiator N-1919, 25.0 g of a zirconia dispersion liquid, and 60.1 g of PGMEA were fed and mixed using a rotation-revolution type vacuum mixer (Awatori Rentaro ARE-310) to provide 100.0 g of a photosensitive insulation paste (E-6). The resulting photosensitive insulation paste (E-6) was spread over a 4 inch silicone wafer and the refractive index at a wavelength of 550 nm was measured at room temperature of 23° C. using a prism coupler (PC-2000, manufactured by Metricon). Results showed that it was 1.66.

Production Example 12: Transparent Adhesive Film (b-2)

In a 100 mL clean bottle, 70.7 g of acrylic copolymer SK2094 (manufactured by Soken Chemical & Engineering Co., Ltd.), 6.1 g of particles with a high refraction index, 0.4 g of crosslinking agent KBM-403 (manufactured by Shin-Etsu Chemical Co., Ltd.), and 22.9 g of PGMEA were fed and mixed using a rotation-revolution type vacuum mixer (Awatori Rentaro ARE-310) to provide 100.0 g of an adhesive agent composition. The adhesive agent composition was spread over a release film and dried at 100° C. for 2 minutes to form an adhesive layer with a thickness of 25 μm, and then a release film was attached to the adhesive layer to produce a transparent adhesive film (b-2). The refractive index at a wavelength of 550 nm of the resulting transparent adhesive film was measured and results showed that it was 1.51.

Evaluation methods used in the examples and comparative examples are as follows.

<Evaluation for Visibility>

For the first wiring substrate prepared in each example and comparative example, a black film was attached to the opposite surface to the one having opaque wiring electrodes and then; while applying light to the wiring substrate using a floodlight projector, 10 testers observed it visually from a position 30 cm away and determined if the mesh-like electrode portion was visible. A sample was rated as E if it was visible for 8 or more testers, rated as D if it was visible for 5 or more and less than 8 testers, rated as C if it was visible for 3 or more and less than 5 testers, rated as B if it was visible for 1 or more and less than 3 testers, and rated as A if it was invisible for the 10 testers, and assessed as acceptable if rated as D or higher.

<Measurement for Reflectance R1>

For the first wiring substrate prepared in each example and comparative example, an antireflection film was attached to the surface of the transparent protective layer using a rubber roller in order to suppress reflection at the interface between the transparent protective layer and air. Furthermore, a black film was attached to the surface of the transparent substrate using a rubber roller in order to suppress reflection at the interface between the transparent substrate and air, thereby preparing a first substrate for reflectance evaluation as illustrated in FIG. 3. For the regions containing opaque wiring electrodes in the resulting first substrate for reflectance evaluation, the reflectance R3 was measured through the transparent protective layer. Furthermore, as illustrated in FIG. 4, the reflectance R4 was measured in the same way for the regions containing no opaque wiring electrodes in the first substrate for reflectance evaluation. From the measured reflectances R3 and R4, the difference R3-R4 was calculated to give the reflectance R1. The reflectances R3 and R4 were determined by a spectrophotometer (CM-2500d, manufactured by Konica Minolta Sensing, Inc.) by measuring the luminous reflectance (Y value) under the conditions of a D65 light source and a field of view of 10°.

<Measurement of Reflectance R2>

For the transparent substrate prepared in each example and comparative example, an antireflection film was attached to one surface of the transparent substrate using a rubber roller. Furthermore, a black film was attached to the other surface of the transparent substrate using a rubber roller to prepare a second substrate for reflectance evaluation as illustrated in FIG. 5. For the second substrate for reflectance evaluation, the reflectance R5 was measured through the antireflection film. From the measured reflectance R5 and reflectance R4, the difference R4-R5 was calculated to give the reflectance R2. The reflectance R5 was determined by a spectrophotometer (CM-2500d, manufactured by Konica Minolta Sensing, Inc.) by measuring the luminous reflectance (Y value) under the conditions of a D65 light source and a field of view of 10°.

<Evaluation for Reflectance R in Regions Containing Opaque Wiring Electrodes>

For the first wiring substrate prepared in each example and comparative example, the difference R3-R5 was calculated from the measured reflectance R5 and reflectance R3 to give the reflectance R in the regions containing opaque wiring electrodes. A sample was rated as A if the reflectance R was less than 0.12%, rated as B if it was 0.12% or more and less than 0.16%, rated as C if it was 0.16% or more and less than 0.26%, and rated as D if it was 0.26% or more.

<Evaluation for Ion Migration Resistance>

For the second wiring substrate prepared in each example and comparative example, a positive and a negative electric terminal were connected to the terminal portions and it was immersed in a constant temperature and humidity tank maintained at 85° C. and 85 RH % while applying a 5 V direct current and measuring the changes in electric resistance. The time at which the electric resistance decreased to 15,630Ω was defined as the short circuiting time, and a sample was rated as A if the short circuiting time was 500 hours or more, rated as B if it was less than 500 hours and 100 hours or more, and rated as C if it was less than 100 hours.

<Evaluation for Adhesiveness>

For the first wiring substrate prepared in each example and comparative example, a PET film was attached to one surface of the transparent protective layer using a rubber roller, and the adhesive strength was measured using an adhered and coated film peeling analysis instrument (VPA, manufactured by Kyowa Interface Science Co., Ltd.) under the conditions of a peeling speed of 300 mm/min and a peeling angle of 180°. A sample was rated as A if the adhesive strength was 3.0 N/25 mm or more and rated as B if the adhesive strength was less than 3.0 N/25 mm.

<Evaluation for Contact>

For the first wiring substrate prepared in each example and comparative example, the regions containing opaque wiring electrodes were subjected to contact test according to the crosscut method specified in JIS K 5600-5-6: 1999. A sample was rated as A if it fell under class 0, rated as B if it fell under class 1 or 2, and rated as C if it fell under any of classes 3 to 5.

Example 1

[Preparation of First Wiring Substrate]
<Formation of Opaque Wiring Electrode>

Figure 10:
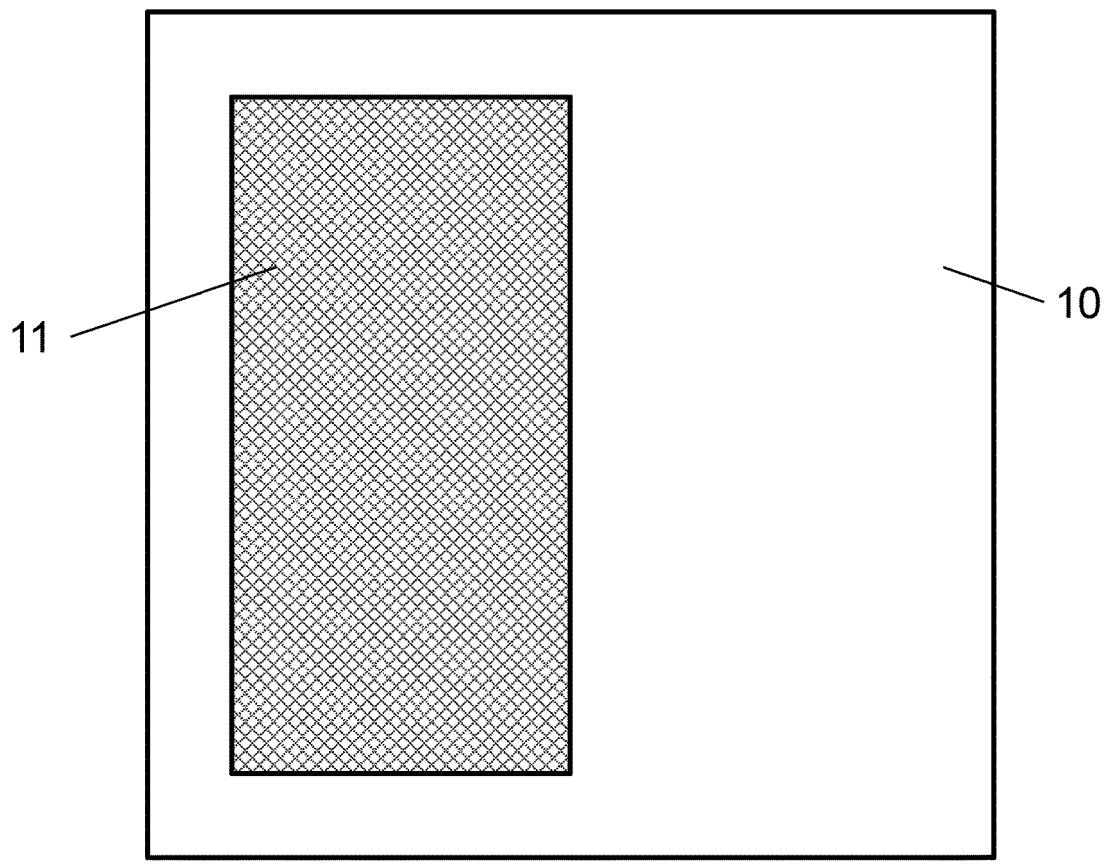
Figure 11:
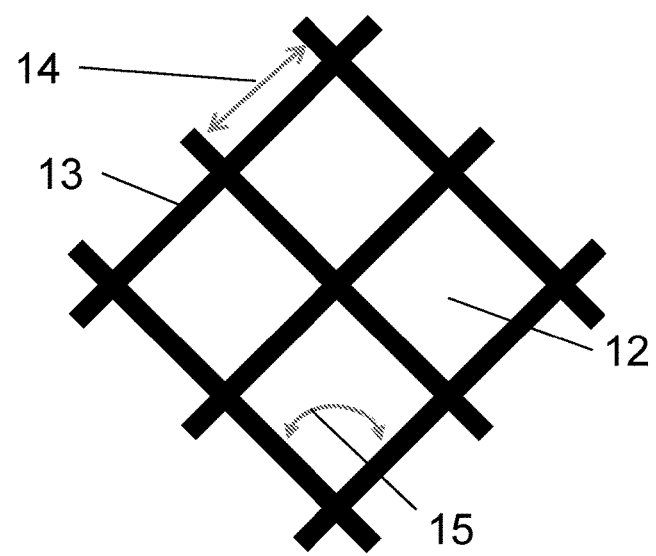
FIG. 11 This gives a schematic diagram of the mesh pattern of a mask used in an Example.

The photosensitive electrically conductive paste (D-1) prepared in Production example 3 was spread over one surface of the transparent substrate (a-1) by spin coating so that it would have a thickness of 1 µm after drying, and then it was dried at 90° C. for 8 minutes. Then, as illustrated in FIG. 10 and FIG. 11, it was irradiated with a light exposure of 100 mJ/cm$^2$ (converted for wavelength 365 nm) through a light irradiation mask having a mask mesh portion of a mesh shape with a mesh pitch of 150 µm and a mesh angle of 90° and a mask shielding portion using a light irradiation instrument (PEM-6M, manufactured by Union Optical Co., Ltd.). The mask aperture width was 4 µm. Subsequently, using a 0.1% aqueous solution of tetramethyl ammonium hydroxide as developer, it was subjected to development for a period twice as long as the time required for dissolving the light-irradiated portion, rinsed with ultrapure water for 30 seconds, and heated in a box oven at 240° C. for 60 minutes to provide a substrate having opaque wiring electrodes. The resulting opaque wiring electrodes were observed under an optical microscope and consequently found to have a line width of 4 µm.

<Formation of Light-Shielding Layer>

For the resulting substrate having opaque wiring electrodes, the surface having opaque wiring electrodes thereon was coated with the light-shielding paste prepared in Production example 6 by spin coating so as to form light-shielding layers with a thickness of 0.5 µm after drying, and it was dried at 80° C. for 5 minutes. Then, it was irradiated with a light exposure of 500 mJ/cm$^2$ (converted for wavelength 365 nm) using the opaque wiring electrodes as mask through the surface opposite to the one having opaque wiring electrodes. Subsequently, using a 2.38% aqueous solution of tetramethyl ammonium hydroxide as developer, it was subjected to immersion development for 50 seconds to form light-shielding layers on the opaque wiring electrodes. In addition, it was heated in a box oven at 240° C. for 60 minutes to provide a substrate having light-shielding layers.

<Formation of Transparent Protective Layer>

For the resulting substrate having light-shielding layers, the surface having opaque wiring electrodes and light-shielding layers was coated with the photosensitive electrically insulating paste (E-1) prepared in Production example 8 by spin coating so as to from a film that would have a thickness of 1.5 µm after drying, and then it was dried at 80° C. for 5 minutes. Subsequently, it was irradiated with a light exposure of 100 mJ/cm$^2$ (converted for wavelength 365 nm) through a light irradiation mask using a light irradiation instrument (PEM-6M, manufactured by Union Optical Co., Ltd.). Then, using a 0.1% aqueous solution of tetramethyl ammonium hydroxide as developer, it was developed for 30 seconds, rinsed with ultrapure water for 30 seconds, and heated in a box oven at 240° C. for 60 minutes to provide a first wiring substrate as illustrated in FIG. 2. The resulting first wiring substrate was subjected to visibility evaluation, reflectance R1 measurement, evaluation of reflectance R in the regions containing opaque wiring electrodes, adhesiveness evaluation, and contact evaluation,

[Preparation of Second Wiring Substrate]

Figure 13:
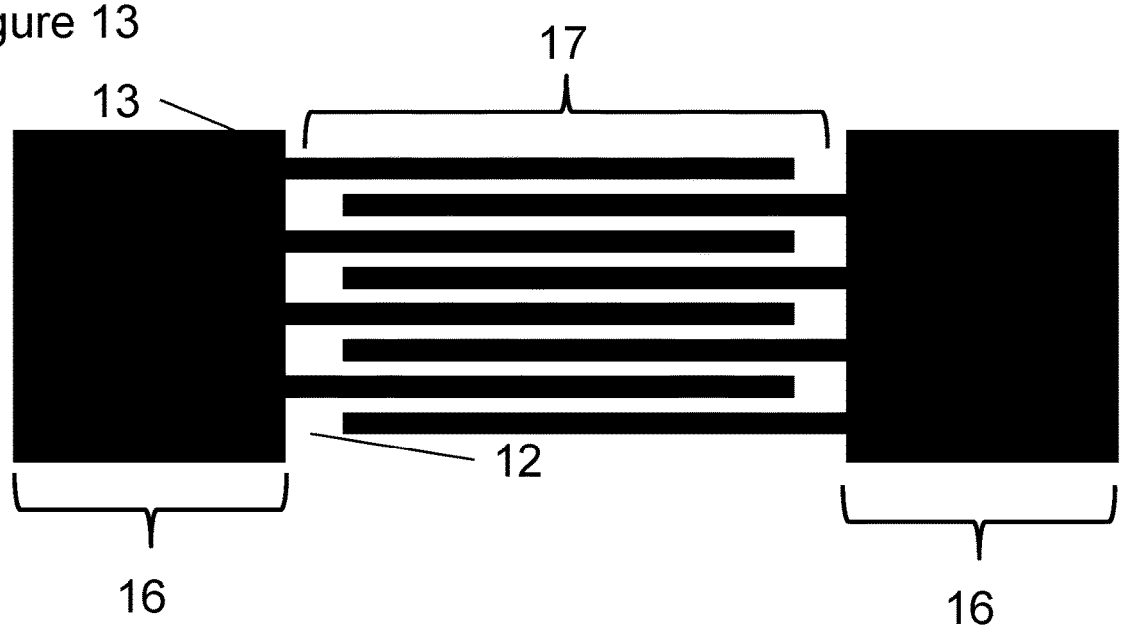
FIG. 13 This gives a schematic diagram of the mesh pattern of a mask used in Examples.

Except that a light irradiation mask having a line width of 10 μm and a line space of 10 μm as illustrated in FIG. 13 was adopted for the <Formation of opaque wiring electrode>, that after light irradiation for the <Formation of light-shielding layer>, only the wiring portions were light-shielded, followed by re-irradiation through the film surface with a light exposure of 500 mJ/cm$^2$ (converted for wavelength 365 nm), and that the terminal portions were light-shielded when performing light irradiation for the <Formation of transparent protective layer>, the same procedure as for producing the first wiring substrate was carried out to produce a second wiring substrate. The resulting second wiring substrate was subjected to evaluation for ion migration resistance.

Examples 2 to 7

Except for adopting the transparent substrate, the photosensitive insulation paste for transparent protective layer formation, and the light irradiation mask pattern for opaque wiring electrode formation that are specified in Table 1, the same procedure as in Example 1 was carried out to produce a first wiring substrate and a second wiring substrate as illustrated in FIG. 2.

Example 8

[Preparation of First Wiring Substrate]
<Formation of Opaque Wiring Electrode>

Except for adopting the photosensitive electrically conductive paste (D-2) instead of the photosensitive electrically conductive paste (D-1) and also adopting a pattern having a mesh shape with a pitch of 450 μm and an angle of 90° along with a mask aperture width of 12 μm, the same procedure as for the <Formation of opaque wiring electrode> in Example 1 was carried out to produce a substrate having opaque wiring electrodes. The resulting opaque wiring electrodes were observed under an optical microscope and consequently found to have a line width of 12 μm.
<Formation of Transparent Protective Layer>

For the resulting substrate having opaque wiring electrodes, the same procedure as for the <Formation of transparent protective layer> in Example 1 was carried out to form a transparent protective layer on the surface having opaque wiring electrodes to produce a first wiring substrate as illustrated in FIG. 1.

[Preparation of Second Wiring Substrate]

Except for adopting the photosensitive electrically conductive paste (D-2) instead of the photosensitive electrically conductive paste (D-1) and omitting the formation of light-shielding layers, the same procedure as for the [Preparation of second wiring substrate] in Example 1 was carried out to produce a second wiring substrate.

Example 9

Except for adopting the photosensitive insulation paste for transparent protective layer formation that is specified in Table 1, the same procedure as in Example 8 was carried out to produce a first wiring substrate and a second wiring substrate as illustrated in FIG. 1.

Example 10

[Preparation of First Wiring Substrate]
<Formation of Opaque Wiring Electrode>

Except for using a pattern having a mesh shape with a pitch of 450 μm and an angle of 90° along with a mask aperture width of 12 μm, the same procedure as in Example 1 was carried out to produce a substrate having opaque wiring electrodes. The opaque wiring electrodes were observed under an optical microscope and consequently found to have a line width of 12 μm.
<Formation of Light-Shielding Layer>

The resulting substrate having opaque wiring electrodes was immersed in the aqueous solution for blackening electrodes prepared in Production example 7 for 30 seconds, then rinsed with water, and dried to produce a substrate having light-shielding layers in which light-shielding layers were disposed on the surfaces of the opaque wiring electrodes.
<Formation of Transparent Protective Layer>

For the resulting substrate having light-shielding layers, except for adopting the photosensitive insulation paste (E-3) instead of the photosensitive insulation paste (E-1), the same procedure as in Example 1 was carried out to produce a transparent protective layer on the surface having opaque wiring electrodes and light-shielding layers formed thereon, thereby providing a first wiring substrate as illustrated in FIG. 2.

[Preparation of Second Wiring Substrate]

Except that a light irradiation mask having a line width of 10 μm and a line space of 10 μm as illustrated in FIG. 13 was adopted for the <Formation of opaque wiring electrode> and that the terminal portions were light-shielded when performing light irradiation for the <Formation of transparent protective layer>, the same procedure as for producing the first wiring substrate was carried out to produce a second wiring substrate.

Example 11

[Preparation of First Wiring Substrate]
<Formation of First Opaque Wiring Electrode>

Except for using a pattern having a mesh shape with a pitch of 300 μm and an angle of 90°, the same procedure as in Example 1 was carried out to produce a substrate having opaque wiring electrodes (referred to below as the first opaque wiring electrodes in this Example). The first opaque wiring electrodes were observed under an optical microscope and consequently found to have a line width of 4 μm.
<Formation of First Transparent Protective Layer>

For the resulting substrate having the first opaque wiring electrodes, except for adopting the photosensitive insulation paste (E-3) instead of the photosensitive insulation paste (E-1), the same procedure as for the <Formation of transparent protective layer> in Example 1 was carried out to produce a transparent protective layer (referred to below as the first transparent protective layer in this Example) to cover the surface having the first opaque wiring electrodes formed thereon, thereby providing a substrate having the first transparent protective layer.
<Formation of Second Opaque Wiring Electrode>

For the resulting substrate having the first transparent protective layer, the same procedure as for the formation of the first opaque wiring electrodes was carried out to produce second opaque wiring electrodes on the surface having the first transparent protective layer formed thereon to produce a substrate having the second opaque wiring electrodes. The second opaque wiring electrodes were observed under an optical microscope and consequently found to have a line width of 4 µm.

<Formation of Light-Shielding Layer>

For the resulting substrate having the second opaque wiring electrodes, the same procedure as for the <Formation of light-shielding layer> in Example 1 was carried out to form light-shielding layers on the surface having the second opaque wiring electrodes formed thereon in such a manner that they were disposed at the positions corresponding to the opaque wiring electrodes. In addition, it was heated in a box oven at 240° C. for 60 minutes to provide a substrate having light-shielding layers.

<Formation of Second Transparent Protective Layer>

For the resulting substrate having light-shielding layers, the same procedure as for the <Formation of first transparent protective layer> was carried out to form a second transparent protective layer on the surface having opaque wiring electrodes and light-shielding layers formed thereon to provide a wiring substrate as illustrated in FIG. 7.

[Preparation of Second Wiring Substrate]

Except that a light irradiation mask having a line width of 10 µm and a line space of 10 µm as illustrated in FIG. 13 was adopted for the <Formation of first opaque wiring electrode>, that the terminal portions were light-shielded when performing light irradiation for the <Formation of first transparent protective layer>, that a light irradiation mask having a line width of 10 µm and a line space of 10 µm as illustrated in FIG. 13 was adopted for the <Formation of second opaque wiring electrode>, that light irradiation was performed using a light irradiation mask placed in such a manner that it did not overlap the first opaque wiring electrodes, that after light irradiation for the <Formation of light-shielding layer>, only the wiring portions were light-shielded, followed by re-irradiation through the film surface with a light exposure of 500 mJ/cm$^2$ (converted for wavelength 365 nm), and that the terminal portions were light-shielded when performing light irradiation for the <Formation of second transparent protective layer>, the same procedure as for producing the first wiring substrate was carried out to produce a second wiring substrate.

Example 12

[Preparation of First Wiring Substrate]
<Formation of First Opaque Wiring Electrode>

Except for adopting the transparent substrate (a-2) instead of the transparent substrate (a-1) and using a pattern having a mesh shape with a pitch of 300 µm and an angle of 90° along with a mask aperture width of 4 µm, the same procedure as for the <Formation of opaque wiring electrode> in Example 1 was carried out to produce a substrate having the first opaque wiring electrodes. The resulting first opaque wiring electrodes were observed under an optical microscope and consequently found to have a line width of 4 µm.

<Formation of Second Opaque Wiring Electrode>

For the resulting substrate having opaque wiring electrodes, the same procedure as for the formation of the first opaque wiring electrodes was carried out to produce second opaque wiring electrodes on the opposite surface to the one having the first opaque wiring electrodes formed thereon to produce a substrate having second opaque wiring electrodes. The second opaque wiring electrodes were observed under an optical microscope and consequently found to have a line width of 4 µm.

<Formation of Light-Shielding Layer>

For the resulting substrate having the second opaque wiring electrodes, the same procedure as for the <Formation of light-shielding layer> in Example 1 except for adopting a light exposure of 3,000 mJ/cm$^2$ was carried out to form light-shielding layers on the surface having the first opaque wiring electrodes formed thereon in such a manner that they were disposed at the positions corresponding to the opaque wiring electrodes. In addition, it was heated in a box oven at 240° C. for 60 minutes to provide a substrate having light-shielding layers.

<Formation of First Transparent Protective Layer>

For the resulting substrate having light-shielding layers, the same procedure as for the <Formation of transparent protective layer> in Example 1 except for adopting the photosensitive insulation paste (E-6) instead of the photosensitive insulation paste (E-1) was carried out to produce a first transparent protective layer on the surface having the first opaque wiring electrodes and light-shielding layers formed thereon, thereby providing a substrate having the first transparent protective layer.

<Formation of Second Transparent Protective Layer>

For the resulting substrate having the first transparent protective layer, the same procedure as for the <Formation of first transparent protective layer> was carried out to form a second transparent protective layer on the surface having the second opaque wiring layers electrodes formed thereon to provide a wiring substrate as illustrated in FIG. 9.

[Preparation of Second Wiring Substrate]

Except that a light irradiation mask having a line width of 10 µm and a line space of 10 µm as illustrated in FIG. 13 was adopted for the <Formation of first opaque wiring electrode> and <Formation of second opaque wiring electrode>, that after light irradiation for the <Formation of light-shielding layer>, only the wiring portions were light-shielded, followed by re-irradiation through the film surface with a light exposure of 500 mJ/cm$^2$ (converted for wavelength 365 nm), and that the terminal portions were light-shielded when performing light irradiation for the <Formation of first transparent protective layer> and <Formation of second transparent protective layer>, the same procedure as for producing the first wiring substrate was carried out to produce a second wiring substrate.

Example 13

Except for sputtering a 1 µm thick layer of silicon dioxide on one surface of the transparent substrate (a-1) using a sputtering machine, the same procedure as in Example 1 was carried out to produce a first wiring substrate and a second wiring substrate as illustrated in FIG. 2.

Examples 14 to 17

Except for forming a silicon dioxide layer with a thickness as specified in Table 2, the same procedure as in Example 13 was carried out to produce a first wiring substrate and a second wiring substrate as illustrated in FIG. 2.

Example 18

[Preparation of First Wiring Substrate]
<Formation of Opaque Wiring Electrode>

The same procedure as in Example 14 was carried out to produce a substrate having opaque wiring electrodes. The resulting first opaque wiring electrodes were observed under an optical microscope and consequently found to have a line width of 4 μm.

<Formation of Light-Shielding Layer>

For the resulting substrate having opaque wiring electrodes, the same procedure as in Example 1 was carried out on the surface having opaque wiring electrodes formed thereon to produce a substrate having light-shielding layers.

<Formation of First Transparent Protective Layer>

Except for adopting the photosensitive insulation paste (E-3) instead of the photosensitive insulation paste (E-1), the same procedure as for the <Formation of transparent protective layer> in Example 1 was carried out to produce a first transparent protective layer, thereby providing a substrate having the first transparent protective layer.

<Formation of Second Transparent Protective Layer>

For the resulting substrate having the first transparent protective layer, a transparent adhesive film (b-1) was attached using a rubber roller to form a second transparent protective layer on the surface having the first transparent protective layer formed thereon to provide a first wiring substrate as illustrated in FIG. 12.

[Preparation of Second Wiring Substrate]

Except that a light irradiation mask having a line width of 10 μm and a line space of 10 μm as illustrated in FIG. 13 was adopted for the <Formation of opaque wiring electrode>, that after light irradiation for the <Formation of light-shielding layer>, only the wiring portions were light-shielded, followed by re-irradiation through the film surface with a light exposure of 500 mJ/cm² (converted for wavelength 365 nm), that the terminal portions were light-shielded when performing light irradiation for the <Formation of first transparent protective layer>, and that in the <Formation of second transparent protective layer>, a transparent adhesive film (b-1) was attached using a rubber roller to only the wiring portion of the surface having the first transparent protective layer formed thereon, the same procedure as for producing the first wiring substrate was carried out to produce a second wiring substrate.

Example 19

Except for adopting the second transparent protective layer (b-2) instead of (b-1), the same procedure as in Example 18 was carried out to produce a first wiring substrate and a second wiring substrate as illustrated in FIG. 12.

Example 20

[Preparation of First Wiring Substrate]
<Formation of Opaque Wiring Electrode>

The same procedure as for the <Formation of opaque wiring electrode> under [Preparation of first wiring substrate] in Example 14 was carried out to produce a substrate having opaque wiring electrodes. The resulting first opaque wiring electrodes were observed under an optical microscope and consequently found to have a line width of 4 μm.

<Formation of Light-Shielding Layer>

For the resulting substrate having opaque wiring electrodes, the same procedure as for the <Formation of light-shielding layer> in Example 14 was carried out on the surface having opaque wiring electrodes formed thereon to produce a substrate having light-shielding layers.

<Formation of Transparent Protective Layer>

For the resulting substrate having light-shielding layers, a transparent adhesive film (b-2) was attached using a rubber roller to the surface having light-shielding layers formed thereon to form a transparent protective layer, thereby providing a first wiring substrate as illustrated in FIG. 2.

[Preparation of Second Wiring Substrate]

Except that a light irradiation mask having a line width of 10 μm and a line space of 10 μm as illustrated in FIG. 13 was adopted for the <Formation of opaque wiring electrode>, that after light irradiation for the <Formation of light-shielding layer>, only the wiring portions were light-shielded, followed by re-irradiation through the film surface with a light exposure of 500 mJ/cm² (converted for wavelength 365 nm), and that in the <Formation of transparent protective layer>, a transparent adhesive film (b-2) was attached using a rubber roller to only the wiring portion of the surface having light-shielding layers formed thereon, the same procedure as for producing the first wiring substrate was carried out to produce a second wiring substrate.

Comparative Example 1

Except for adopting the photosensitive insulation paste specified in Table 3 to form opaque wiring electrodes, the same procedure as in Example 8 was carried out to produce a first wiring substrate and a second wiring substrate as illustrated in FIG. 1.

Comparative Examples 2 to 5

Except for adopting the transparent substrate and the photosensitive insulation paste for transparent protective layer formation that are specified in Table 3, the same procedure as in Example 1 was carried out to produce a first wiring substrate and a second wiring substrate as illustrated in FIG. 2.

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| transparent substrate | substrate | a-1 | a-1 | a-1 | a-2 | a-1 | a-1 | a-1 | a-1 | a-1 | a-1 |
|  | refractive index n1 | 1.52 | 1.52 | 1.52 | 1.68 | 1.52 | 1.52 | 1.52 | 1.52 | 1.52 | 1.52 |
|  | thickness of inorganic film | — | — | — | — | — | — | — | — | — | — |
| opaque wiring electrode | photosensitive electrically conductive paste | D-1 | D-1 | D-1 | D-1 | D-1 | D-1 | D-1 | D-2 | D-2 | D-1 |
|  | line width (μm) | 4 | 4 | 4 | 4 | 8 | 6 | 12 | 12 | 12 | 12 |
|  | pitch (μm) | 150 | 150 | 150 | 150 | 150 | 90 | 150 | 450 | 450 | 450 |
| thickness of light-shielding layer (μm) |  | 0.5 | 0.5 | 0.5 | 0.5 | 0.5 | 0.5 | 0.5 | — | — | <0.1 |

TABLE 1-continued

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| transparent protective layer | photosensitive insulation paste | E-1 | E-2 | E-3 | E-6 | E-1 | E-3 | E-1 | E-1 | E-3 | E-3 |
|  | refractive index n2 (n2a) | 1.50 | 1.53 | 1.55 | 1.66 | 1.50 | 1.55 | 1.50 | 1.50 | 1.55 | 1.55 |
| area of regions containing opaque wiring electrodes (area ratio in transparent substrate) |  | 5.3% | 5.3% | 5.3% | 5.3% | 10.5% | 12.9% | 15.4% | 5.3% | 5.3% | 5.3% |
| n2 (n2a)/n1 |  | 0.99 | 1.01 | 1.02 | 0.99 | 0.99 | 1.02 | 0.99 | 0.99 | 1.02 | 1.02 |
| R1 |  | 0.03 | 0.03 | 0.03 | 0.03 | 0.04 | 0.05 | 0.05 | 0.10 | 0.10 | 0.08 |
| R2 |  | 0.03 | 0.03 | 0.05 | 0.03 | 0.03 | 0.05 | 0.03 | 0.03 | 0.05 | 0.05 |
| R3 |  | 0.39 | 0.39 | 0.41 | 0.39 | 0.4 | 0.43 | 0.41 | 0.46 | 0.48 | 0.46 |
| R4 |  | 0.36 | 0.36 | 0.38 | 0.36 | 0.36 | 0.38 | 0.36 | 0.36 | 0.38 | 0.38 |
| R5 |  | 0.33 | 0.33 | 0.33 | 0.33 | 0.33 | 0.33 | 0.33 | 0.33 | 0.33 | 0.33 |
| R1:R2 |  | 1.0:1.0 | 1.0:1.0 | 1.0:1.7 | 1.0:1.0 | 1.3:1.0 | 1.0:1.0 | 1.7:1.0 | 3.3:1.0 | 2.0:1.0 | 1.6:1.0 |
| visibility |  | A | A | A | A | A | A | B | D | C | B |
| contact |  | C | C | C | B | C | C | C | C | C | C |
| ion migration resistance |  | A | A | A | A | A | A | A | A | A | A |
| adhesiveness |  | B | B | B | B | B | B | B | B | B | B |
| reflectance R in regions containing opaque wiring electrodes |  | 0.06 | 0.06 | 0.08 | 0.06 | 0.07 | 0.10 | 0.08 | 0.13 | 0.15 | 0.13 |
|  |  | A | A | A | A | A | A | A | B | B | B |

TABLE 2

|  |  | Example 11 | Example 12 | Example 13 | Example 14 | Example 15 | Example 16 | Example 17 | Example 18 | Example 19 | Example 20 |
|---|---|---|---|---|---|---|---|---|---|---|---|
| transparent substrate | substrate | a-1 | a-2 | a-1 | a-1 | a-1 | a-1 | a-1 | a-1 | a-1 | a-1 |
|  | refractive index n1 | 1.52 | 1.68 | 1.52 | 1.52 | 1.52 | 1.52 | 1.52 | 1.52 | 1.52 | 1.52 |
|  | thickness of inorganic film (nm) | — | — | 1 | 10 | 30 | 40 | 55 | 10 | 10 | 10 |
| opaque wiring electrode | photosensitive electrically conductive paste | D-1 | D-1 | D-1 | D-1 | D-1 | D-1 | D-1 | D-1 | D-1 | D-1 |
|  | line width (μm) | 4 | 4 | 4 | 4 | 4 | 4 | 4 | 4 | 4 | 4 |
|  | pitch (μm) | 300 | 300 | 150 | 150 | 150 | 150 | 150 | 150 | 150 | 150 |
| thickness of light-shielding layer (μm) |  | 0.5 | 0.5 | 0.5 | 0.5 | 0.5 | 0.5 | 0.5 | 0.5 | 0.5 | 0.5 |
| transparent protective layer | photosensitive insulation paste | E-3 | E-6 | E-1 | E-1 | E-1 | E-1 | E-1 | E-3 | E-3 | — |
|  | transparent adhesive film | — | — | — | — | — | — | — | b-1 | b-2 | b-2 |
|  | refractive index n2 (n2a) | 1.55 | 1.66 | 1.50 | 1.50 | 1.50 | 1.50 | 1.50 | 1.55 | 1.55 | — |
|  | refractive index n2b | — | — | — | — | — | — | — | 1.48 | 1.51 | 1.51 |
| area of regions containing opaque wiring electrodes (area ratio in transparent substrate) |  | 5.3% | 5.3% | 5.3% | 5.3% | 5.3% | 5.3% | 5.3% | 5.3% | 5.3% | 5.3% |
| n2 (n2a)/n1 |  | 1.02 | 0.99 | 0.99 | 0.99 | 0.99 | 0.99 | 0.99 | 1.02 | 1.02 | — |
| n2b/n1 |  | — | — | — | — | — | — | — | 0.97 | 0.99 | 0.99 |
| n2a/n2b |  | — | — | — | — | — | — | — | 1.05 | 1.03 | — |
| R1 |  | 0.03 | 0.03 | 0.03 | 0.03 | 0.03 | 0.03 | 0.03 | 0.03 | 0.03 | 0.03 |
| R2 |  | 0.05 | 0.06 | 0.03 | 0.03 | 0.07 | 0.09 | 0.15 | 0.09 | 0.04 | 0.02 |
| R3 |  | 0.41 | 0.42 | 0.39 | 0.39 | 0.43 | 0.45 | 0.51 | 0.45 | 0.4 | 0.38 |
| R4 |  | 0.38 | 0.39 | 0.36 | 0.36 | 0.40 | 0.42 | 0.48 | 0.42 | 0.37 | 0.35 |
| R5 |  | 0.33 | 0.33 | 0.33 | 0.33 | 0.33 | 0.33 | 0.33 | 0.33 | 0.33 | 0.33 |
| R1:R2 |  | 1.0:1.7 | 1.0:2.0 | 1.0:1.0 | 1.0:1.0 | 1.0:2.3 | 1.0:3.0 | 1.0:5.0 | 1.0:3.0 | 1.0:1.3 | 1.5:1.0 |
| visibility |  | A | A | A | A | A | A | D | A | A | A |
| contact |  | C | B | C | A | A | A | A | A | A | A |
| ion migration resistance |  | A | A | A | A | A | A | A | A | A | C |
| adhesiveness |  | B | B | B | B | B | B | B | A | A | A |
| reflectance R in regions containing opaque wiring electrodes |  | 0.08 | 0.09 | 0.06 | 0.06 | 0.10 | 0.14 | 0.18 | 0.12 | 0.09 | 0.08 |
|  |  | A | A | A | A | A | A | C | B | A | A |

TABLE 3

|  |  | Comparative example 1 | Comparative example 2 | Comparative example 3 | Comparative example 4 | Comparative example 5 |
|---|---|---|---|---|---|---|
| transparent substrate | substrate | a-1 | a-2 | a-1 | a-1 | a-2 |
|  | refractive index n1 | 1.52 | 1.68 | 1.52 | 1.52 | 1.68 |
|  | thickness of inorganic film | — | — | — | — | — |
| opaque wiring electrode | photosensitive electrically conductive paste | D-1 | D-1 | D-1 | D-1 | D-1 |
|  | line width (μm) | 12 | 4 | 4 | 4 | 4 |
|  | pitch (μm) | 450 | 150 | 150 | 150 | 150 |
| thickness of light-shielding layer (μm) |  | — | 0.5 | 0.5 | 0.5 | 0.5 |
| transparent protective layer | photosensitive insulation paste | E-1 | E-1 | E-4 | E-5 | E-3 |
|  | refractive index n2 (n2a) | 1.50 | 1.50 | 1.58 | 1.61 | 1.55 |
| area of regions containing opaque wiring electrodes (area ratio in transparent substrate) |  | 5.3% | 5.3% | 5.3% | 5.3% | 5.3% |
| n2 (n2a)/n1 |  | 0.99 | 0.89 | 1.04 | 1.06 | 0.92 |
| R1 |  | 0.37 | 0.03 | 0.03 | 0.03 | 0.03 |
| R2 |  | 0.03 | 0.32 | 0.11 | 0.16 | 0.16 |
| R3 |  | 0.73 | 0.68 | 0.47 | 0.52 | 0.52 |
| R4 |  | 0.36 | 0.65 | 0.44 | 0.49 | 0.49 |
| R5 |  | 0.33 | 0.33 | 0.33 | 0.33 | 0.33 |
| R1:R2 |  | 12.3:1.0 | 1.0:10.7 | 1.0:3.7 | 1.0:5.3 | 1.0:5.3 |
| visibility |  | E | E | E | E | E |
| contact |  | C | B | C | C | B |
| ion migration resistance |  | A | A | A | A | A |
| adhesiveness |  | B | B | B | B | B |
| reflectance R in regions containing opaque wiring electrodes |  | 0.40 D | 0.35 D | 0.14 B | 0.19 C | 0.19 C |

EXPLANATION OF NUMERALS

1: transparent substrate
2: opaque wiring electrode
3: light-shielding layer
4: transparent protective layer
5: wiring substrate
6: antireflection film
7: black film
8: first substrate for reflectance evaluation
9: second substrate for reflectance evaluation
10: mask-shaded portion
11: mask mesh portion
12: light-shaded portion
13: aperture portion
14: mesh pitch
15: mesh angle
16: terminal portion
17: wiring portion

The invention claimed is:

1. A wiring substrate comprising a transparent substrate, patterned opaque wiring electrodes formed on at least one surface of the transparent substrate, and a transparent protective layer formed on the transparent substrate and on the opaque wiring electrodes, wherein
the transparent protective layer comprises either
(1) an insulation layer that exhibits ion migration resistance formed from glass or at least one resin of the group consisting of polyimide, acrylic, cards, epoxy, melamine, urethane, silicone based and fluorine based, and
an adhesive layer; or
(2) a cured film that is cured by ultraviolet ray treatment and/or heat treatment of a photosensitive composition containing a monomer having an unsaturated double bond and a photo initiator;
the internal reflectance R1 in the regions containing opaque wiring electrode formed thereon are 0.1% or less as measured through the transparent protective layer on the wiring substrate, and the refractive index n1 of the transparent substrate and the refractive index n2 of the transparent protective layer satisfy equation (1) given below:

$$0.97 \leq n2/n1 \leq 1.03 \quad (1);$$

and the ratio R1:R2 of the value R1 to the reflectance R2 at the interface between the transparent protective layer and the transparent substrate is in the range of 1:3 to 3:1.

2. A wiring substrate as set forth in claim 1, wherein light-shielding layers are present on the opaque wiring electrodes.

3. A wiring substrate as set forth in claim 2, wherein each light-shielding layer is a cured film of a resin composition containing a black pigment.

4. A wiring substrate as set forth in claim 1, wherein each opaque wiring electrode has a line width of 1 to 10 μm.

5. A wiring substrate as set forth in claim 1, wherein an inorganic film with a thickness of 5 to 50 nm is present on that surface of the transparent substrate that has a transparent protective layer formed thereon.

6. A wiring substrate as set forth in claim 1, wherein the transparent protective layer comprises at least one insulation layer disposed on the transparent substrate and the opaque wiring electrodes; and at least one adhesive layer disposed on the insulation layer; and the refractive index n2a of the insulation layer and the refractive index n2b of the adhesive layer satisfy equation (2) given below:

$$0.97 \leq n2a/n2b \leq 1.03 \qquad (2).$$

7. A wiring substrate as set forth in claim 1, wherein the adhesive layer is formed from at least one resin selected from the group consisting of acrylic, silicone, urethane, polyimide, polyvinyl ether, vinyl acetate/vinyl chloride copolymer, modified polyolefin, fluorine-based, natural rubber and synthetic rubber.

* * * * *